US012416079B2

(12) United States Patent
Cho et al.

(10) Patent No.: US 12,416,079 B2
(45) Date of Patent: Sep. 16, 2025

(54) METHOD AND APPARATUS FOR FILLING GAP USING ATOMIC LAYER DEPOSITION

(71) Applicants: Samsung Electronics Co., Ltd., Suwon-si (KR); INCHEON NATIONAL UNIVERSITY RESEARCH & BUSINESS FOUNDATION, Incheon (KR)

(72) Inventors: Eunhyoung Cho, Suwon-si (KR); Sunghee Lee, Suwon-si (KR); Jeongyub Lee, Yongin-si (KR); Han-Bo-Ram Lee, Seoul (KR)

(73) Assignees: Samsung Electronics Co., Ltd., Gyeonggi-Do (KR); INCHEON NATIONAL UNIVERSITY RESEARCH & BUSINESS FOUNDATION, Incheon (KR)

( * ) Notice: Subject to any disclaimer, the term of this patent is extended or adjusted under 35 U.S.C. 154(b) by 693 days.

(21) Appl. No.: 17/740,838

(22) Filed: May 10, 2022

(65) Prior Publication Data

US 2023/0070312 A1 Mar. 9, 2023

(30) Foreign Application Priority Data

Sep. 8, 2021 (KR) .......... 10-2021-0119859
Oct. 18, 2021 (KR) .......... 10-2021-0138735

(51) Int. Cl.
*C23C 16/455* (2006.01)
*C23C 16/40* (2006.01)
*H01L 21/02* (2006.01)

(52) U.S. Cl.
CPC ...... *C23C 16/45525* (2013.01); *C23C 16/401* (2013.01); *H01L 21/02164* (2013.01); *H01L 21/0228* (2013.01)

(58) Field of Classification Search
CPC ..... C23C 16/04; C23C 16/042; C23C 16/045; C23C 16/45525; C23C 16/45527; C23C 16/45553; C23C 16/401
See application file for complete search history.

(56) References Cited

U.S. PATENT DOCUMENTS 7,833,855 B2    11/2010   Kang et al.
9,812,320 B1    11/2017   Pore et al.
(Continued)

FOREIGN PATENT DOCUMENTS

KR       10-0538094 B1      12/2004
KR    10-2015-0099451 A      8/2015
(Continued)

OTHER PUBLICATIONS

Lee, et al. "Cyclic Deposition/Etching Process to Etch a Bowing-Free SiO2 Contact Hole," Journal of Electrochemical Society, No. 156(8), D269-D274 (2009).
(Continued)

*Primary Examiner* — Michael P Wieczorek
(74) *Attorney, Agent, or Firm* — Harness, Dickey & Pierce, P.L.C.

(57) ABSTRACT

A method and an apparatus for filling a gap by using an atomic layer deposition (ALD) method are provided. The method includes forming a first reaction inhibition layer on a side wall of the gap; forming a first precursor layer by adsorbing a first reactant into a bottom of the gap and the side wall of the gap around the bottom of the gap; and forming a first atomic layer on the bottom of the gap and the side wall of the gap around the bottom of the gap by adsorbing a second reactant into the first precursor layer. The forming of the first reaction inhibition layer may include adsorbing a first reaction inhibitor into the side wall of the
(Continued)

gap; and forming a second reaction inhibitor by removing a specific ligand from the first reaction inhibitor.

14 Claims, 33 Drawing Sheets

(56) References Cited

U.S. PATENT DOCUMENTS

| | | |
|---|---|---|
| 10,037,884 B2 | 7/2018 | Ou et al. |
| 10,861,959 B2 | 12/2020 | Chui et al. |
| 10,930,551 B2 | 2/2021 | Huang et al. |
| 11,028,477 B2 | 6/2021 | Saly et al. |
| 11,133,180 B2 | 9/2021 | Kang et al. |
| 2021/0005460 A1 | 1/2021 | Hausmann et al. |
| 2021/0395888 A1 | 12/2021 | Cho et al. |
| 2022/0119939 A1* | 4/2022 | Noh ................ H01L 21/02189 |

FOREIGN PATENT DOCUMENTS

| | | |
|---|---|---|
| KR | 10-2018-0061387 A | 6/2018 |
| KR | 10-2020-0012008 A | 2/2020 |
| KR | 10-2021-0157310 A | 12/2021 |

OTHER PUBLICATIONS

Khan, et al. "Area-Selective Atomic Layer Deposition Ssing Si Precursor as Inhibitors," Chemistry of Materials, Chem. Mater., No. 30, pp. 7603-7610 (2018).

Cho, et al. "Modulation of the adsorption chemistry of a precursor in atomic layer deposition to enhance the growth per cycle of a TiO2 thin film," Royal Society of Chemistry, Phys. Chem. Chem. Phys., No. 23, pp. 2568-2574 (2021).

Zydor, et al. "TiCp*(OMe)3 versus Ti(OMe)4 in Atomic Layer Deposition of TiO2 with Water—Ab Initio Modelling of Atomic Layer Deposition Surface Reactions," Journa lof Nanoscience and Nanotechnology, vol. 11,pp. 8089-8093 (2011).

* cited by examiner

METHOD AND APPARATUS FOR FILLING GAP USING ATOMIC LAYER DEPOSITION

CROSS-REFERENCE TO RELATED APPLICATIONS

This application is based on and claims priority under 35 U.S.C. § 119 to Korean Patent Application Nos. 10-2021-0119859 and 10-2021-0138735, filed on Sep. 8, 2021 and Oct. 18, 2021, respectively, in the Korean Intellectual Property Office, the disclosures of each of which are incorporated by reference herein in their entireties.

BACKGROUND

Example embodiments relate to a method and/or an apparatus for filling a gap using atomic layer-deposition (ALD).

Atomic layer deposition (ALD) has been used as a process of filling a gap, such as a trench, etc., formed in or on a substrate. During ALD, a surface reaction is used. Thus, when a gap is filled by using ALD, a filling layer may be formed at a uniform thickness on surfaces around the gap so that formation of voids may be reduced in size and/or likelihood of occurrence, e.g. minimized. However, when the gap has a high aspect ratio, a size of an entrance of the gap may be less than a size of an inner portion of the gap. Thus, even when ALD is used, voids may be formed.

SUMMARY

One or more example embodiments provide a method and/or an apparatus for filling a gap using atomic layer deposition (ALD).

Additional aspects will be set forth in part in the description which follows and, in part, will be apparent from the description, and/or may be learned by practice of example embodiments.

According to some example, there is provided a method of filling a gap formed on a substrate by using atomic layer deposition (ALD) including forming a first reaction inhibition layer on a side wall of the gap; forming a first precursor layer by adsorbing a first reactant into a bottom of the gap and the side wall of the gap around the bottom of the gap; and forming a first atomic layer on the bottom of the gap and the side wall of the gap around the bottom of the gap by adsorbing a second reactant into the first precursor layer. The forming of the first reaction inhibition layer includes: adsorbing a first reaction inhibitor into the side wall of the gap; and forming a second reaction inhibitor by removing a specific ligand from the first reaction inhibitor. The first reaction inhibitor is adsorbed to have a density gradient in which a density of the first reaction inhibitor decreases toward the bottom of the gap. The second reaction inhibitor includes a precursor material that does not react with the second reactant.

The second reaction inhibitor may be formed by removing at least a part of a ligand having an adsorption characteristic from the first reaction inhibitor by using a specific gas.

The second reaction inhibitor may have a greater adsorption density than that of the first reaction inhibitor.

The specific gas may include at least one of water ($H_2O$), ammonia ($NH_3$) or hydrogen ($H_2$).

The density gradient of the first reaction inhibitor may be determined based on the equation, $$l = \frac{4w}{3}\left(\sqrt{1+\frac{3}{8}\left(\frac{Pt}{S\sqrt{2\pi mkT}}\right)} - 1\right)$$

wherein, $l$ denotes a depth in nm at a location of the side wall of the gap into which the first reaction inhibitor is adsorbed, w denotes a width in nm of the gap, P denotes a partial pressure Pa of the first reaction inhibitor in a reaction chamber, t denotes an exposure time s of the first reaction inhibitor, S denotes a saturation dose (defined to be $\approx 2.5 \times 10^{18}$ molecules·meter), m denotes a molecular mass in kg of the first reaction inhibitor, k denotes a Boltzmann factor equal to $1.38 \times 10^{-23}$ J/K, and T denotes a temperature K in the first reaction chamber.

The first reaction inhibitor may include a center metal and an organic ligand.

The organic ligand may include at least one of Cp(cyclopentadienyl) ligand or a Cp*(pentamethyl cyclopentadienyl) ligand.

The first reaction inhibitor may include at least one of $(Me_2N)_2SiMe_2$, $TiCp^*(OMe)_3$, $Ti(CpMe)(O^iPr)_3$, $Ti(CpMe)(NMe_2)_3$, $ZrCp(NMe_2)_3$, $ZrCp_2Cl_2$, $Zr(Cp_2CMe_2)Me_2$, $Zr(Cp_2CMe_2)Me(OMe)$, $HfCp(NMe_2)_3$, $Hf(CpMe)(NMe_2)_3$, or $Ru(EtCP)_2$.

The first reaction inhibitor may include a same center metal as that of the first reactant.

The second reaction inhibitor may be oxidized by at least one of ozone ($O_3$) or oxygen ($O_2$) plasma.

The second reaction inhibitor may not react with water ($H_2O$) and may not react with oxygen ($O_2$).

The first reactant may include at least one of $TiCl_4$, $Ti(O^iPr)_4$, $Ti(Nme_2)_4$, $Ti(NmeEt)_4$, $Ti(Net_2)_4$, $ZrCl_4$, $Zr(Nme_2)_4$, $Zr(OtBu)_4$, $ZrCp_2Me_2$, $Zr(MeCp)_2(Ome)Me$, $HfCl_4$, $Hf(Nme_2)_4$, $Hf(NetMe)_4$, $Hf(Net_2)_4$, $HfCp_2Me_2$, $Hf(MeCp)_2(Ome)Me$, or β-diketonate Ru precursor, dicarbonyl-bis(5-methyl-2,4-hexanediketonato) Ru(II) ("Carish", $C_{16}H_{22}O_6Ru$).

The second reactant may include at least one of water ($H_2O$) or oxygen ($O_2$).

The method may further include forming a first filling layer by repeatedly performing the forming of the first precursor layer and the forming of the first atomic layer for a plurality of cycles.

A density of the first reaction inhibitor may decrease toward a bottom of the gap so that the first filling layer is formed from the bottom of the gap in a bottom-up direction.

The method may further include, after forming the first filling layer, forming a second reaction inhibition layer on the side wall of the gap; forming a second precursor layer on an upper surface of the first filling layer and the side wall of the gap around the upper surface of the first filling layer; and forming a second atomic layer on the upper surface of the first filling layer and the side wall of the gap around the upper surface of the first filling layer.

The method may further include forming a second filling layer from the upper surface of the first filling layer in the bottom-up direction by repeatedly performing the forming of the second precursor layer and the forming of the second atomic layer for a plurality of cycles.

The method may further include, before forming the first reaction inhibition layer on the side wall of the gap, forming an upper atomic layer on a surface of the substrate around an entrance of the gap.

The upper atomic layer may include a same material as that of the first atomic layer. The upper atomic layer may be formed by reacting the first reaction inhibitor with at least one of ozone ($O_3$) or oxygen ($O_2$) plasma.

According to some example embodiments, there is provided a method of filling a gap formed on a substrate by using atomic layer deposition (ALD) including forming a first filling layer by sequentially adsorbing first and second reactants into a side wall and a bottom of the gap; forming a first reaction inhibition layer on the first filling layer formed on the side wall of the gap; forming a first precursor layer by having the first reactant into the first filling layer formed on the bottom of the gap and around the bottom of the gap; and forming a first atomic layer on the first filling layer formed on the bottom of the gap and around the bottom of the gap by adsorbing the second reactant into the first precursor layer. The forming of the first reaction inhibition layer includes: adsorbing a first reaction inhibitor into the side wall of the gap; and forming a second reaction inhibitor by removing a specific ligand from the first reaction inhibitor. The first reaction inhibitor is adsorbed to have a density gradient in which a density of the first reaction inhibitor decreases toward the bottom of the gap. The second reaction inhibitor includes a precursor material that does not react with the second reactant.

The method may further include forming a second filling layer from an upper surface of the first filling layer in a bottom-up direction by repeatedly performing the forming of the first precursor layer and the forming of the first atomic layer for a plurality of cycles.

According to some example embodiments, there is provided a device defining a gap having a high aspect ratio; and a filling layer filling the gap, the filling layer filled by the method of filling the gap.

The gap may have a width of a nano size (e.g. less than or equal to 10 nm), and an aspect ratio greater than or equal to 10.

The device may include a meta lens including a nanostructure in which the gap is defined, and the filling layer that fills the gap and has a refractive index greater than that of the nanostructure.

The device may include an interconnect structure including an insulating layer in which the gap is formed, and the filling layer that fills the gap and includes a conductive material.

The device may include a three-dimensional (3D) NAND flash memory device including a plurality of memory cells through which the gap passes and is formed, and the filling layer that fills the gap and includes an insulating material.

According to some example embodiments, there is provided an atomic layer deposition (ALD) apparatus configured to process a substrate including a plurality of processing areas; and a reactant supply device configured to be on the substrate and configured to fill a gap formed on each of the plurality of processing areas. The substrate and the reactant supply device are configured to be relatively rotatable. The reactant supply device includes: at least one first supply unit configured to supply a first reaction inhibitor to be adsorbed into a sidewall of the gap; at least one second supply unit configured to form a precursor layer on a bottom of the gap and a side wall of the gap around the bottom of the gap by supplying a first reactant; and at least one third supply unit configured to form an atomic layer on the bottom of the gap and the side wall of the gap around the bottom of the gap by supplying a second reactant. The at least one third supply unit is configured to form a second reaction inhibitor by supplying the second reactant to the adsorbed first reaction inhibitor and removing a specific ligand from the first reaction inhibitor. The second reaction inhibitor includes a precursor material that does not react with the second reactant.

Purging units may be provided between the at least one first through third supply units.

The first reaction inhibitor may be adsorbed to have a density gradient in which a density of the first reaction inhibitor decreases toward the bottom of the gap.

The density gradient of the first reaction inhibitor may be determined according to a rotational speed and the number of rotations of the substrate.

BRIEF DESCRIPTION OF THE DRAWINGS

The above and other aspects, features, and/or advantages of some example embodiments will be more apparent from the following description taken in conjunction with the accompanying drawings, in which.

DETAILED DESCRIPTION

Figure 1:
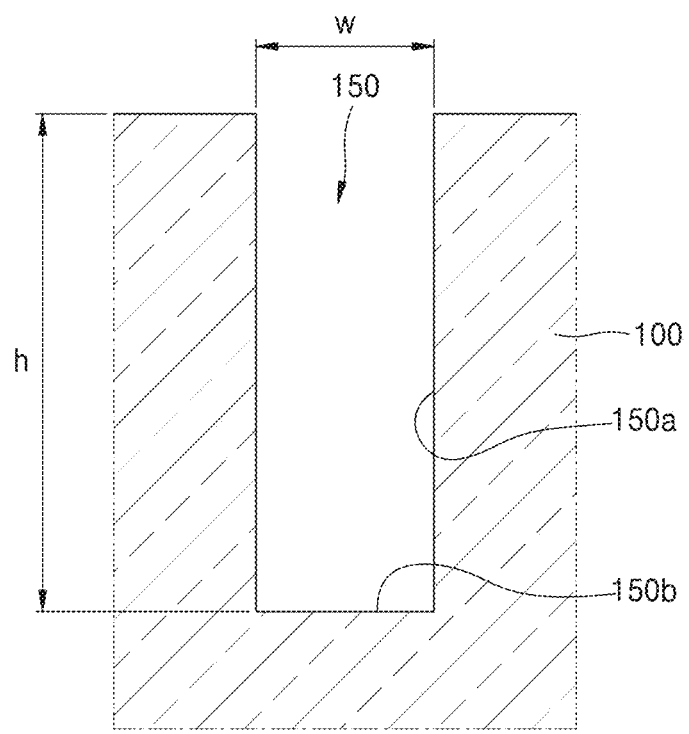
FIGS. 1 through 13 are diagrams illustrating a method of filling a gap according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, various example embodiments are described in detail with reference to the accompanying drawings. In the drawings, the same reference numerals denote the same elements and the sizes of elements may be exaggerated for clarity and convenience of explanation. Example embodiments described hereinafter are only examples, and various modifications may be made based on example embodiments.

Hereinafter, it will be understood that when an element is referred to as being "on" or "above" another element, the element can be directly over or under the other element and directly on the left or on the right of the other element, or intervening elements may also be present therebetween. As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent.

Unless orders of operations included in a method are specifically described or there are contrary descriptions, the operations may be performed according to appropriate orders.

The use of all examples and/or example terms are merely for describing the disclosure in detail and embodiments are not limited to the examples and the example terms, unless they are not defined in the scope of the claims.

A high efficiency flat meta lens of a nanostructure having a high precision and a high aspect ratio has been developed. The high efficiency flat meta lens may be broadly employed in various fields, such as at least one of a laser-based microscope, imaging techniques, spectroscopy techniques, etc. A method of filling a gap, which is to be described hereinafter, may be applied as a manufacturing/fabrication technique of a meta surface device requiring or using a nanostructure having a high precision and a high aspect ratio.

As a semiconductor device has been highly integrated, planar sizes of discrete devices or interconnection have been gradually decreased. However, thicknesses of layers included in the semiconductor device have been gradually increased. Additionally, along with the development of a multi-layer technique of three-dimensionally arranging or connecting the discrete devices of the semiconductor device has been developed, a large step height may occur and a deep gap having a high aspect ratio may be formed, on a surface of a process substrate, according to each processing operation. When an interlayer insulating layer is formed on the process substrate having the large step height and the deep gap having the high aspect ratio, voids, etc. may be more easily formed. Methods of filling the gap to be described hereinafter may be applied in manufacturing of a semiconductor device, as a technique for filling a deep gap having a high aspect ratio, which is formed in a process substrate.

Alternatively or additionally, the method of filling the gap described below may be used in various fields, for which forming a thin layer is important, such as optical sensors including a photoelectron device, an oxygen sensor, an optical measurer, etc., catalysts including a hydrogen photocatalyst, a catalyst in the artificial biotechnology, biomedical materials and devices, and the like.

FIGS. 1 through 13 are diagrams illustrating a method of filling a gap 150, according to some example embodiments.

In the method of filling the gap 150, according to some example embodiments, first through third reaction inhibition layers 111, 112, and 113 including a second reaction inhibitor may be formed by adsorbing a first reaction inhibitor into a side wall 150a of the gap 150 and then processing the first reaction inhibitor. Next, a first atomic layer 131 may be formed by having a first reactant, which is a precursor material, and a second reactant, which is a co-reactant of the first reactant, adsorbed into a bottom 150b of the gap 150 and around the bottom 150b of the gap 150 through an atomic layer deposition (ALD) process. Thereafter, the first and second reactants may be repeatedly adsorbed for a plurality of cycles to form first through third filling layers 141, 142, and 143 from the bottom 150b of the gap 150 in a bottom-up direction. Hereinafter, the method of filling the gap 150, according to some example embodiments, is described in detail.

Referring to FIG. 1, a substrate 100 including the gap 150 may be disposed in a reaction chamber (not shown) of an ALD apparatus. Here, the gap 150 in the substrate 100 may have a certain width w and a certain depth h.

The gap 150 may have, for example, a high aspect ratio, e.g. a ratio of depth h to width w, of greater than or equal to about 10, but is not limited thereto. Here, the aspect ratio denotes a ratio h/w of a depth h to a width w of the gap 150. The gap 150 may have, for example, a width w of about dozens of nm. As a detailed example, the gap 150 may have a width w of about 20 nm to about 100 nm. However, this is only an example, and the width w of the gap 150 may be variously modified.

Figure 2:
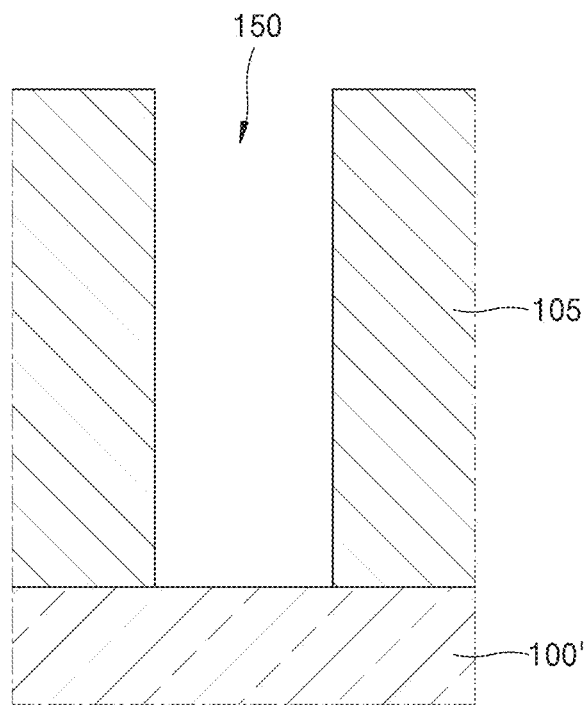

As illustrated in FIG. 2, a structure in which a material layer 105 having the gap 150 is formed on a substrate 100' may be provided in a reaction chamber. For example, the substrate 100' may include silicon such as single-crystal silicon and may be or may include a wafer, and the material layer 105 may include silicon oxide. In this case, an etch stop layer (not shown) including $HfO_2$ may further be provided between the substrate 100' and the material layer 105.

Figure 3:
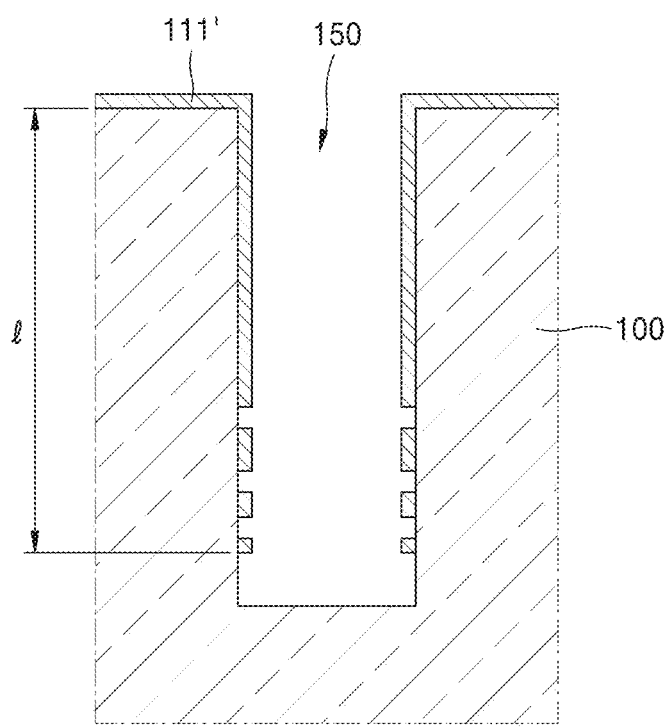
Figure 4:
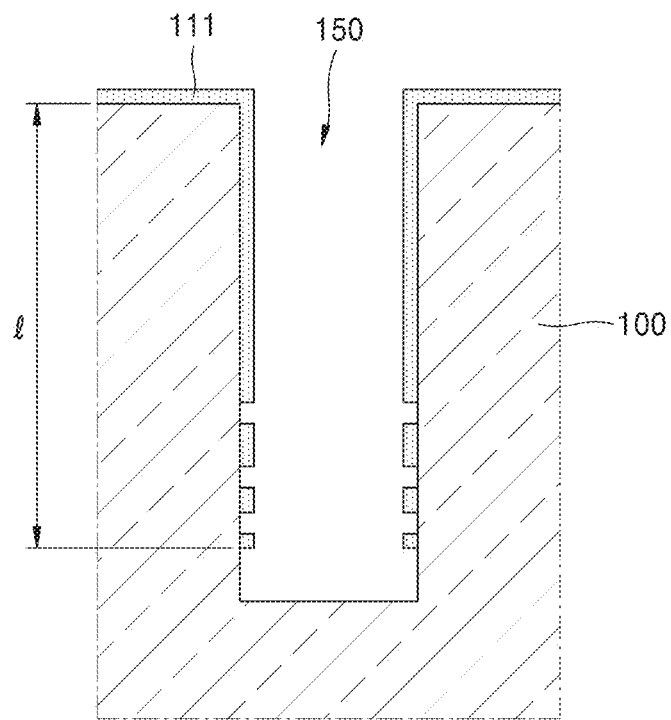

Referring to FIGS. 3 and 4, the first reaction inhibition layer 111 may be formed on the side wall 150a of the gap 150. As will be described below, the first reaction inhibition layer 111 may be formed by adsorbing the first reaction inhibitor into the side wall 150a of the gap 150 and then removing at least a part of a ligand having an adsorption characteristic from the first reaction inhibitor, and converting the first reaction inhibitor into the second reaction inhibitor. Here, the first and second reaction inhibitors may include a precursor material that does not form a thin film by a reaction with the second reactant which is used as the co-reactant in the ALD process that is performed after the first reaction inhibition layer 111 is formed. Hereinafter, a method of forming the first reaction inhibition layer 111 on the side wall 150a of the gap 150 is described in detail.

Referring to FIG. 3, a reaction inhibition precursor layer 111' may be formed on the side wall 150a of the gap 150. The reaction inhibition precursor layer 111' may be formed by adsorbing the first reaction inhibitor into the side wall 150a of the gap 150. Here, the first reaction inhibitor may include a precursor material that does not react with the second reactant which is used as the co-reactant in the ALD process that is performed after the first reaction inhibition layer 111 is formed.

The reaction inhibition precursor layer 111' may have a density gradient in which a density of the first reaction inhibitor decreases from an entrance of the gap 150 toward the bottom 150b. Thus, the bottom 150b of the gap 150 and around the bottom 150b may not be covered by the first reaction inhibition precursor layer 111' and may be exposed.

Hereinafter, a material of the first reaction inhibitor is described.

The first reaction inhibitor may have basic characteristics that are similar as those of a previous ALD precursor having a process compatibility with the ALD process. Specifically, the first reaction inhibitor needs to have excellent reactivity so as to have a short exposure time, good volatility so as to be easily vaporized, and good thermal adsorbability with respect to the substrate 100. Also, the first reaction inhibitor needs to be or is desired to be at least thermally stable and to generate volatile by-products having no reactivity, and needs to be or is desired to be at least highly pure, economically feasible, easy to handle, and environmentally friendly in order to be suitable for mass production. Thus, the first reaction inhibitor may be selected from among various ALD precursors.

Also, the first reaction inhibitor may further have to include the following two characteristics.

First, the first reaction inhibitor may be changed into a thin layer only by being oxidized by a strong co-reactant, such as an oxygen ($O_2$) plasma or ozone ($O_3$). Second, the first reaction inhibitor may not react with either or both of water ($H_2O$) or oxygen ($O_2$) used as the co-reactant in the ALD process that is performed after the first reaction inhibition layer 111 is formed.

Hereinafter, Ti(OMe)$_4$ and TiCp*(OMe)$_3$ used as an ALD precursor for forming a TiO$_2$ thin layer are compared. Here, Me corresponds to $CH_3$ and Cp* corresponds to pentamethyl cyclopentadienyl.

When a Ti(OMe)$_4$ precursor is used, a TiO$_2$ thin layer may be grown at a growth per cycle (GPC) of about 0.4 to about 0.6 angstroms/cycle, in an ALD process using water ($H_2O$) as a co-reactant at a temperature equal to or less than 300° C. However, when the TiCp*(OMe)$_3$ precursor is used, the TiO$_2$ thin layer may not be formed in the ALD process using water ($H_2O$) as the co-reactant. The TiO$_2$ thin layer may be formed only by using an oxygen ($O_2$) plasma or ozone ($O_3$) as the co-reactant.

The TiCp*(OMe)$_3$ precursor may be strongly adsorbed into TiO$_2$ through H-bonding. However, it is or may be difficult to form a new Ti—O bond due to a steric hindrance of a Cp* ligand located thereon. Also, due to hydrophobicity of the Cp* ligand, the Cp* ligand may be difficult to be oxidized by reacting with water ($H_2O$) in the ALD process after the first reaction inhibition layer 111 is formed. However, the Cp* ligand may be oxidized by an oxygen ($O_2$) plasma and/or ozone ($O_3$), which are a stronger co-reactant than water ($H_2O$), and thus a thin layer may be formed. Also, the TiCp*(OMe)$_3$ precursor may not be adsorbed into a pure TiO$_2$ surface. Accordingly, it may be found that the TiCp*(OMe)$_3$ precursor has the characteristic of the first reaction inhibitor in a process of forming the TiO$_2$ thin layer using the ALD process.

In detail, when the TiCp*(OMe)$_3$ precursor is used as the first reaction inhibitor and the ALD process is performed by using an ALD precursor for forming the TiO$_2$ thin layer, for example, tetrakis(dimethylamido)titanium (TDMAT), which may be oxidized by water ($H_2O$), the TiO$_2$ thin layer may not be formed in an area coated with the first reaction inhibitor, and TDMAT and water ($H_2O$) may react with each other in an area not coated with the first reaction inhibitor, and thus, the TiO$_2$ thin layer may be formed. Alternatively or additionally, because the TiCp*(OMe)$_3$ precursor is not adsorbed into a surface of TiO$_2$, the TiCp*(OMe)$_3$ precursor may not be invaginated into the TiO$_2$ thin layer as impurities.

The first reaction inhibitor may include a precursor material including a center metal and an organic ligand. In this case, when the first reaction inhibitor includes a precursor material having the same center metal as an ALD precursor of a material to be filled, invagination of impurities due to the first reaction inhibitor may be minimized or reduced. For example, when TDMAT is used as the ALD precursor for forming the TiO$_2$ thin layer, the first reaction inhibitor may include the TiCp*(OMe)$_3$ precursor.

Table 1 below shows examples of a material which may be used as the first reaction inhibitor when forming a thin layer with respect to each of TiO$_2$, ZrO$_2$, and HfO$_2$.

TABLE 1

| Gap-filling material | Inhibtor Precursor | ALD Precursor | Oxygen Source |
|---|---|---|---|
| TiO$_2$ | TiCp*(OMe)$_3$, Ti(CpMe)(O$^i$Pr)$_3$ Ti(CpMe)(NMe$_2$)$_3$ | TiCl$_4$, Ti(O$^i$Pr)$_4$, Ti(NMe$_2$)$_4$, Ti(NMeEt)$_4$, Ti(NEt$_2$)$_4$ | H$_2$O |
| ZrO$_2$ | ZrCp(NMe$_2$)$_3$ ZrCp$_2$Cl$_2$ (MeCp)Zr(NMe$_2$)$_3$, Zr(CpEt)(NMe$_2$)$_3$, Zr(Cp$_2$CMe$_2$)Me$_2$, Zr(Cp$_2$CMe$_2$)Me(OMe) | ZrCl$_4$, Zr(NMe$_2$)$_4$, Zr(O$^t$Bu)$_4$, ZrCp$_2$Me$_2$, Zr(MeCp)$_2$(OMe)Me | H$_2$O |
| HfO$_2$ | Hf($^t$BuO)$_4$, Hf(O$^i$Pr)$_4$, HfCp(NMe$_2$)$_3$, Hf(CpMe)(NMe$_2$)$_3$, Hf(O$^t$Bu)(NEtMe)$_3$ | HfCl$_4$, Hf(NMe$_2$)$_4$, Hf(NEtMe)$_4$, Hf(NEt2)$_4$, HfCp2Me$_2$, Hf(MeCp)$_2$(OMe)Me | H$_2$O |

Referring to Table 1, it may be found that the first reaction inhibitor may have the same center metal as an ALD precursor of a thin layer which is to be formed. The first reaction inhibitor described in Table 1 may have low reactivity with water ($H_2O$), and thus, may not be oxidized.

When the first reaction inhibitor is coated at the level of an atomic layer and the amount of incorporated impurities has no great effects on the performance of a device, the first reaction inhibitor may not necessarily have to have the same center metal as the ALD precursor of the thin layer to be formed. In this case, as the first reaction inhibitor, various precursor materials that does not react with the co-reactant such as water ($H_2O$) or oxygen ($O_2$) may be used, as described with respect to FIG. 2. The materials illustrated in FIG. 2 are only examples and other precursor materials may also be used.

TABLE 2

| Gap-filling material | Inhibitor Precursor | ALD Precursor | Oxygen Source |
|---|---|---|---|
| Oxies Nitrides Metals | $(Me_2N)_2SiMe_2$ TiCp*(OMe)$_3$, Ti(CpMe)(O$^i$Pr)$_3$ Ti(CpMe)(NMe$_2$)$_3$ ZrCp(NMe$_2$)$_3$, ZrCp$_2$Cl$_2$ Zr(Cp$_2$CMe2)Me$_2$ Zr(Cp$_2$CMe$_2$)Me(OMe), HfCp(NMe$_2$)$_3$, Hf(CpMe)(NMe$_2$)$_3$, Ru(EtCP)$_2$ | TiCl$_4$, Ti(OiPr)$_4$, Ti(NMe$_2$)$_4$, Ti(NMeEt)$_4$, Ti(NEt$_2$)$_4$, ZrCl$_4$, Zr(NMe$_2$)$_4$, Zr(O$^t$Bu)$_4$, ZrCp$_2$Me$_2$, Zr(MeCp)$_2$(OMe)Me, HfCl$_4$, Hf(NMe$_2$)$_4$, Hf(NEtMe)$_4$, Hf(NEt$_2$)$_4$, HfCp$_2$Me$_2$, Hf(MeCp)$_2$(OMe)Me, β-diketonate Ru precursor, dicarbonyl-bis(5-methyl-2,4-hexanediketonato) Ru(II) ("Carish", $C_{16}H_{22}O_6RU$) | $H_2O$ or $O_2$ |

The Cp-based precursors used as the first reaction inhibitor, described in Table 2, may have no reactivity with water ($H_2O$) or oxygen ($O_2$) due to a steric hindrance and hydrophobicity, and a thin layer may be formed by separating a ligand only by a strong co-reactant, such as an oxygen ($O_2$) plasma or ozone ($O_3$). Alternatively or additionally, even when the first reaction inhibitor includes only one atomic layer (e.g. a monolayer), it may be difficult for the first reaction inhibitor to be adsorbed into other precursors, due to a steric hindrance, and thus, the first reaction inhibitor may have the blocking characteristics.

When the material of the first reaction inhibitor is selected, the next consideration may be related to controlling a density of the first reaction inhibitor adsorbed into a side wall of a gap. In an ALD process for a bottom-up gap filling method, the reaction inhibition precursor layer 111' may have to be coated on a wall surface of the gap 150 to have a density gradient in which the density of the first reaction inhibitor decreases toward the bottom 150b of the gap 150. Specifically, the density of the first reaction inhibitor may have to be increased around an entrance of the gap 150 and gradually decreased along the side wall 150a of the gap 150 toward the bottom 150b of the gap 150, such that the first reaction inhibitor may not be coated on the bottom 150b of the gap 150. The density gradient of the reaction inhibition precursor layer 111' may be obtained by adjusting the exposure of the first reaction inhibitor.

In detail, the density gradient of the reaction inhibition precursor layer 111' may be determined according to Equation 1 reflecting stoichiometry and diffusion behavior of molecules.

$$l = \frac{4w}{3}\left(\sqrt{1+\frac{3}{8}\left(\frac{Pt}{S\sqrt{2\pi mkT}}\right)} - 1\right) \quad \text{Equation 1}$$

Here, $\ell$ denotes a depth nm to a location of the side wall 150a of the gap 150, into which the first reaction inhibitor is adsorbed, w denotes a width nm of the gap 150, P denotes a partial pressure Pa of the first reaction inhibitor in a reaction chamber, t denotes an exposure time s of the first reaction inhibitor, S denotes saturation dose ($\approx 2.5\times10^{18}$ molecules·meter), m denotes a molecular mass kg of the first reaction inhibitor, k denotes a Boltzmann factor equal to $1.38\times10^{-23}$ Joules/Kelvin, and T denotes a temperature measured in Kelvins in the first reaction chamber.

In Equation 1, $\ell$, the depth to the location of the side wall 150a of the gap 150, into which the first reaction inhibitor is adsorbed, may be determined by adjusting the exposure (that is, multiplication of the partial pressure by the exposure time of the first reaction inhibitor) of the first reaction inhibitor. In this case, the density of the first reaction inhibitor may be increased around the entrance of the gap 150 and may be gradually decreased along the side wall 150a of the gap 150 toward the bottom 150b of the gap 150.

Referring to FIG. 4, the first reaction inhibition layer 111 may be formed by adsorbing the first reaction inhibitor into the side wall 150a of the gap 150 and converting the first reaction inhibitor into the second reaction inhibitor. Here, the second reaction inhibitor may be formed by removing at least a part of a ligand having a chemical or physical adsorption characteristic from a precursor material of the first reaction inhibitor by using a specific gas (e.g., at least one of water ($H_2O$), ammonia ($NH_3$) or hydrogen ($H_2$), etc.)

The second reaction inhibitor does not form a thin film by a reaction with water ($H_2O$) and/or oxygen ($O_2$) used as the co-reactant in the ALD process that is performed after the first reaction inhibition layer 111 is formed, in the same manner as the first reaction inhibitor. Alternatively or additionally, the density gradient of the first reaction inhibition layer 111 according to the depth of the gap 150 may also be the same as the density gradient of the reaction inhibition precursor layer 111' described above. Alternatively or additionally, when the second reaction inhibitor includes a precursor material having the same center metal as an ALD precursor of a material to be filled, invagination of impurities due to the second reaction inhibitor may be minimized or reduced.

As will be described later, when a part of the ligand having the adsorption characteristic is removed from the first reaction inhibitor, the second reaction inhibitor having a higher absorption density than that of the first reaction inhibitor may be formed. Here, the adsorption density means compactness of precursor materials included in the reaction inhibitor.

In general, precursors having structurally large ligands interfere with each other due to steric hindrance between the precursors, and thus the adsorption density may decrease when adsorbed into a substrate. For example, the TiCp* (OMe)$_3$ precursor may include one Cp* ligand and three methoxy ligands with respect to the metal Ti, and chemical bonding with the substrate occurs through one of the three methoxy ligands. However, because there is an empty space that causes a steric hindrance between Cp* ligands and/or between a methoxy ligand and a Cp* ligand, precursors are close to each other and are difficult to be adsorbed into the substrate, which may decrease the adsorption density.

Meanwhile, when the TiCp*(OMe)$_3$ precursor reacts with water ($H_2O$), a methoxy ligand (—OMe) combines with water (H$_2$O), methanol is separated, and a hydroxy group (—OH) is formed, and thus the steric interference between the precursors may be reduced. Accordingly, in some example embodiments, the second reaction inhibitor with the reduced steric hindrance may be formed by performing a water (H$_2$O) process on the TiCp*(OMe)$_3$ precursor which is the first reaction inhibitor. Through an experiment, it was found that the adsorption density of the precursor has been improved from 1.15 nm$^{-2}$ to 1.72 nm$^{-2}$ by performing the water (H$_2$O) process on the TiCp*(OMe)$_3$ precursor. Accordingly, the first reaction inhibition layer 111 having the increased adsorption density may be formed.

Figure 5:
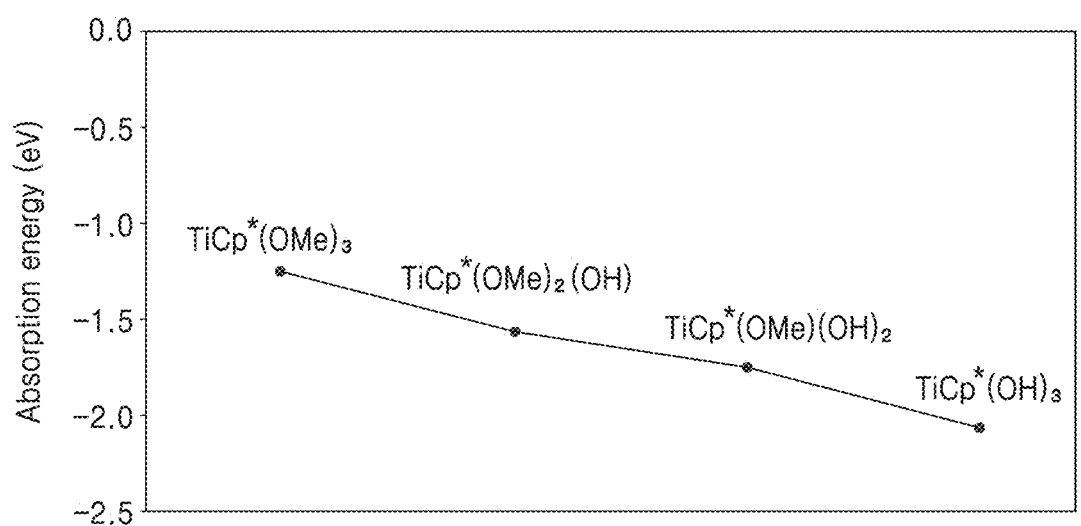

FIG. 5 shows results of performing a discrete or differential Fourier transformation (DFT) calculation on a reaction mechanism between TiCp*(OMe)$_3$ and water (H$_2$O).

Referring to FIG. 5, it may be found that the adsorption energy gradually increases as the amount of the hydroxy group (—OH) formed by a reaction of the methoxy ligand and water (H$_2$O) increases. For example, it may be found that strong and stable adsorption occurs when all of the three methoxy ligands are substituted with hydroxy groups. Alternatively or additionally, when the methoxy ligand reacts with water (H$_2$O), because methanol is formed and separated, the steric hindrance may be reduced so that the adsorption density may be improved.

Figure 6:
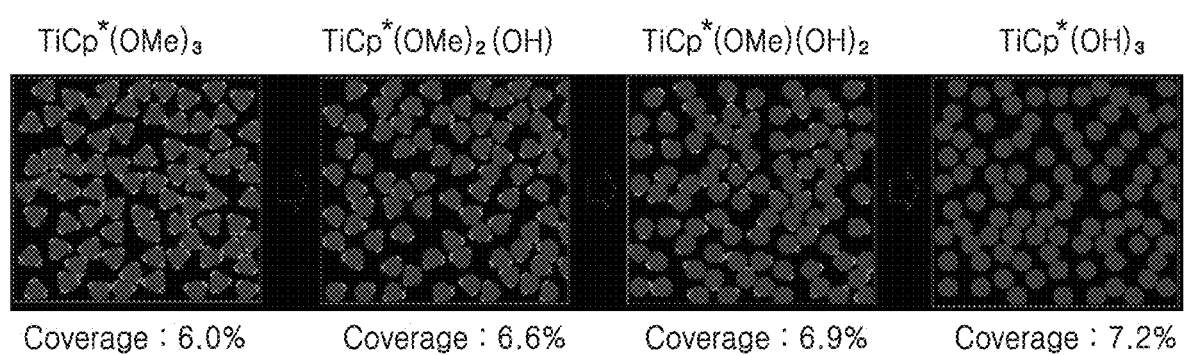

FIG. 6 shows results of performing a Monte Carlo simulation on the reaction mechanism of TiCp*(OMe)$_3$ and water (H$_2$O). FIG. 6 sequentially shows coverage with respect to TiCp*(OMe)$_3$, TiCp*(OMe)$_2$(OH), TiCp*(OMe)(OH)$_2$ and TiCp*(OH)$_3$.

Referring to FIG. 6, it may be found that as the methoxy ligand of TiCp*(OMe)$_3$ reacts with water (H$_2$O) and is sequentially removed, the coverage gradually increases, and accordingly, the adsorption density is gradually improved.

The blocking characteristic of a reaction inhibitor is closely related to the coverage of the reaction inhibitor. When the coverage of the reaction inhibitor adsorbed to the substrate is low, an empty space formed between the precursors of the reaction inhibitor may be a defect site where film forming is made, and thus the blocking characteristic may deteriorate. Therefore, in order to improve the blocking characteristic of the reaction inhibitor, it is necessary to increase the coverage of the reaction inhibitor adsorbed into the substrate.

In some example embodiments, the second reaction inhibitor having a greater adsorption density than that of the first reaction inhibitor may be formed by removing a part of the ligand having the adsorption characteristic from the first reaction inhibitor adsorbed into the side wall 150a of the gap 150. Accordingly, the first reaction inhibition layer 111 having the improved blocking characteristic may be obtained.

Figure 7:
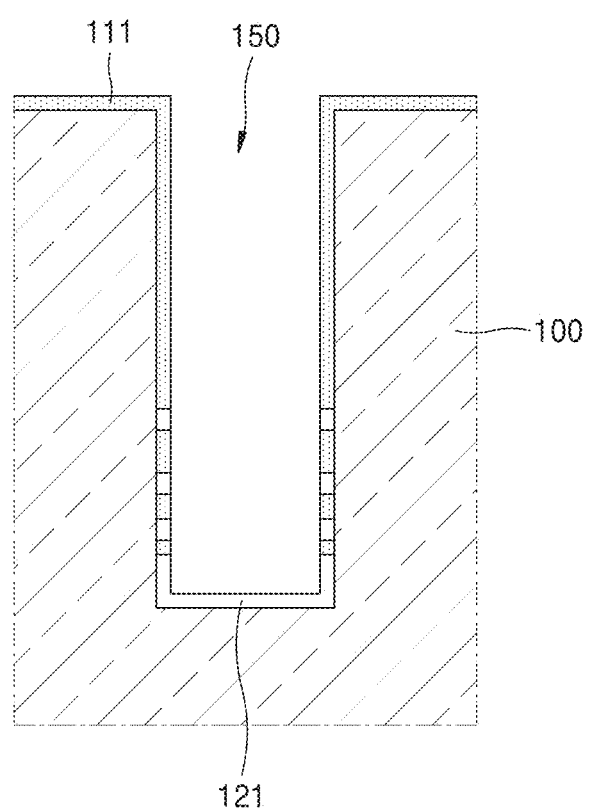

Referring to FIG. 7, a first precursor layer 121 may be formed on and around the bottom 150b of the gap 150. The first precursor layer 121 may be formed by adsorbing the first reactant into and around the bottom 150b of the gap 150. As described above, the first reaction inhibition layer 111 may be formed to have a density gradient in which the density of the reaction inhibitor decreases toward the bottom 150b of the gap 150. Therefore, the bottom 150b of the gap 150 and the side wall 150a therearound may not be coated with the first reaction inhibition layer 111 and may be exposed. The first reactant may be adsorbed into the exposed bottom 150b of the gap 150 and the exposed side wall 150a around the bottom 150b, to form the first precursor layer 121.

The first reactant may include a precursor material of a thin layer to be formed. For example, the first reactant may include TiCl$_4$, Ti(O$^i$Pr)$_4$, Ti(NMe$_2$)$_4$, Ti(NMeEt)$_4$, Ti(NEt$_2$)$_4$, ZrCl$_4$, Zr(NMe$_2$)$_4$, Zr(O$^t$Bu)$_4$, ZrCp$_2$Me$_2$, Zr(MeCp)$_2$(OMe)Me, HfCl$_4$, Hf(NMe$_2$)$_4$, Hf(NEtMe)$_4$, Hf(NEt$_2$)$_4$, HfCp$_2$Me$_2$, Hf(MeCp)$_2$(OMe)Me, or δ-diketonate Ru precursor, dicarbonyl-bis(5-methyl-2,4-hexanediketonato) Ru(II) ("Carish", C$_{16}$H$_{22}$O$_6$Ru), but the first reactant is not limited thereto. After forming the first precursor layer 121, a purging process may be performed.

Referring to FIG. 6, the first atomic layer 131 may be formed on and around the bottom 150b of the gap 150. The first atomic layer 131 may be formed by adsorbing the second reactant into the first precursor layer 121. The second reactant may be a co-reactant and may include, for example, water (H$_2$O) and/or oxygen (O$_2$). The first atomic layer 131 may include at least one of oxide, nitride, or metals, but is not limited thereto.

As described above, the reaction inhibitor may include a precursor material that does not react with the second reactant. Thus, the second reactant introduced into the gap 150 may not react with the first reaction inhibition layer 111 and may react with the first reactant of the first precursor layer 121 to form the first atomic layer 131. As described above, the first atomic layer 131 may be formed only in an area of a wall surface of the gap 150, the area not being coated with the first reaction inhibition layer 111, that is, on the bottom 150b of the gap 150 and the side wall 150a around the bottom 150b. After the first atomic layer 131 is formed, a purging process may be performed.

Figure 8:
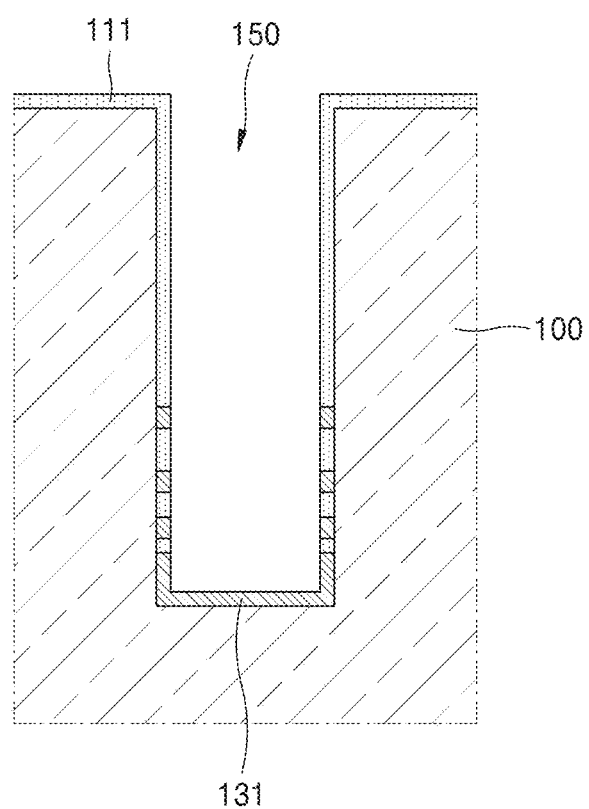

Referring to FIG. 8, the first filling layer 141 may be formed in a lower portion of the gap 150 to have a certain height, by repeatedly performing the adsorption of the first reactant and the adsorption of the second reactant for about dozens to hundreds of cycles (for example, about 30 to about 600 cycles). Here, a cycle may include adsorption of the first reactant, purging, adsorption of the second reactant, and purging. As shown in FIG. 3, when the average density of the reaction inhibitor adsorbed into the side wall of the gap 150 is high, the first filling layer 141 may be formed from the bottom 150b of the gap 150 in a bottom-up direction. The reaction inhibitor may remain on the side wall 150a of the gap 150, the side wall 150a contacting the first filling layer 141.

The amount of the first reaction inhibition layer 111 on the side wall 150a of the gap 150 may be gradually decreased by repeatedly performing the adsorption of the first reactant and the second reactant, and thus, the blocking characteristics of the first reaction inhibition layer 111 may be decreased.

Figure 9:
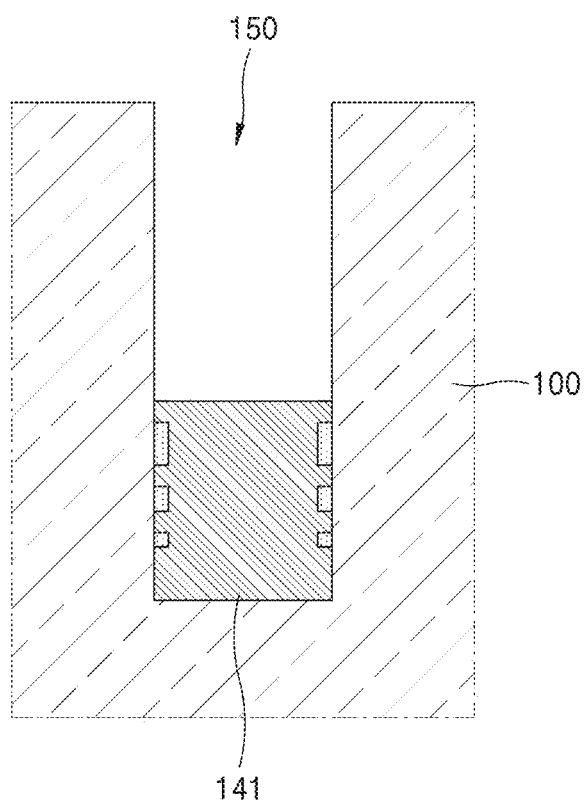

Referring to FIG. 9, the second reaction inhibition layer 112 may be formed on the side wall 150a of the gap 150. Here, the second reaction inhibition layer 112 may be formed by using the same method as used in the first reaction inhibition layer 111. The second reaction inhibition layer 112 may have a density gradient in which a density of the reaction inhibitor decreases from an entrance of the gap 150 toward the first filling layer 141. Thus, an upper surface of the first filling layer 141 and the side wall 150a of the gap 150 around the first filling layer 141 may not be covered by the second reaction inhibition layer 112 and may be exposed. After the second reaction inhibition layer 112 is formed, a purging process may be performed.

Figure 10:
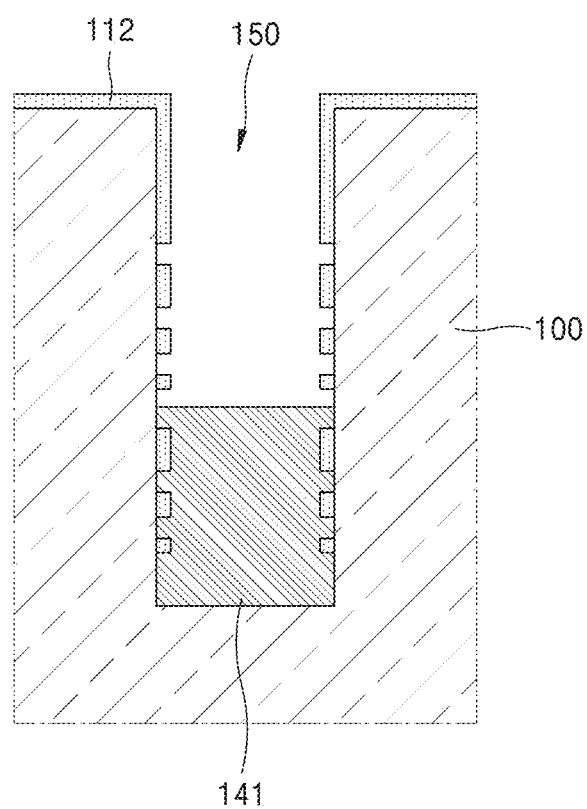

Referring to FIG. 10, a second precursor layer (not shown) may be formed on the upper surface of the first filling layer 141 and the side wall 150a of the gap 150 around the first filling layer 141. The second precursor layer may be formed by adsorbing the first reactant into the upper surface of the first filling layer 141 and the side wall 150*a* of the gap 150 around the first filling layer 141, which are exposed through the second reaction inhibition layer 112. Here, the first reactant may include a precursor material of a thin layer to be formed as described above. After the second precursor layer is formed, a purging process may be performed.

Next, a second atomic layer (not shown) may be formed on the upper surface of the first filling layer 141 and the side wall 150*a* of the gap 150 around the first filling layer 141. The second atomic layer may be formed by adsorbing the second reactant into the second precursor layer. The second reactant may be a co-reactant and may include, for example, water ($H_2O$) and/or oxygen ($O_2$). After the second precursor layer is formed, a purging process may be performed.

Next, the second filling layer 142 may be formed above of the first filling layer 141 to have a certain height, by repeatedly performing the adsorption of the first reactant and the adsorption of the second reactant described above for about dozens to hundreds of cycles. Here, the second filling layer 142 may be formed from the upper surface of the first filling layer 141 in a bottom-up direction. As the adsorption of the first reactant and the adsorption of the second reactant are repeatedly performed, the amount of the second reaction inhibition layer 112 on the side wall 150*a* of the gap 150 may be gradually decreased.

Figure 11:
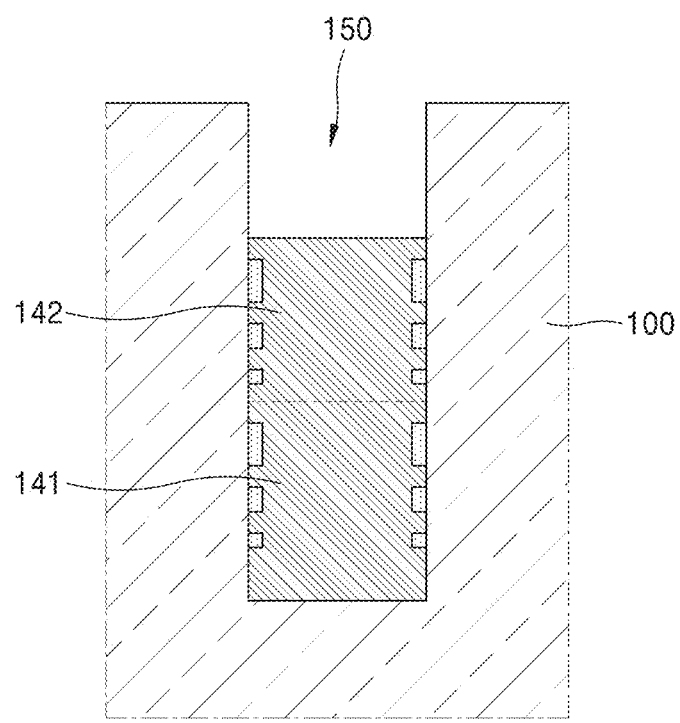

Referring to FIG. 11, the third reaction inhibition layer 113 may be formed on the side wall 150*a* of the gap 150. Here, the third reaction inhibition layer 113 may be formed by using the same method as used in the first reaction inhibition layer 111. Here, the third reaction inhibition layer 113 may have a density gradient in which a density of the reaction inhibitor decreases from an entrance of the gap 150 toward the second filling layer 142. Thus, an upper surface of the second filling layer 142 and the side wall 150*a* of the gap 150 around the second filling layer 142 may not be covered by the third reaction inhibition layer 113 and may be exposed. After the third reaction inhibition layer 113 is formed, a purging process may be performed.

Figure 12:
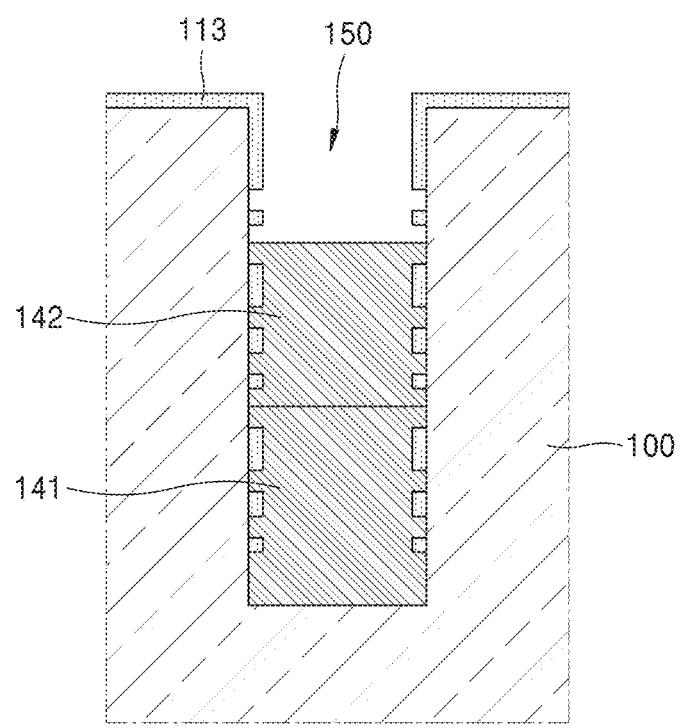

Referring to FIG. 12, a third precursor layer (not shown) may be formed on the upper surface of the second filling layer 142 and the side wall 150*a* of the gap 150 around the second filling layer 142. The third precursor layer may be formed by adsorbing the first reactant into the upper surface of the second filling layer 142 and the side wall 150*a* of the gap 150 around the second filling layer 142, which are exposed through the third reaction inhibition layer 113. After the third precursor layer is formed, a purging process may be performed. Next, a third atomic layer (not shown) may be formed by adsorbing the second reactant into the third precursor layer. Thereafter, after the third atomic layer is formed, a purging process may be performed.

Figure 13:
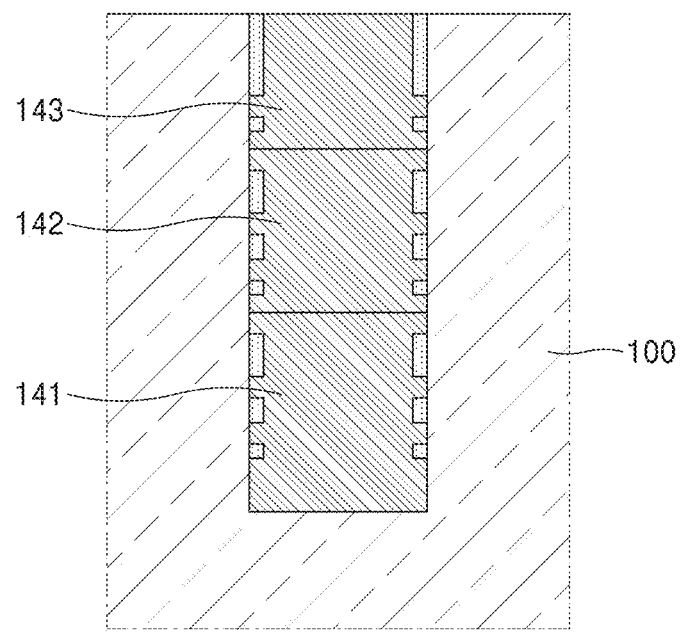

The third filling layer 143 may be formed above the second filling layer 142 to have a certain height as shown in FIG. 13, by repeatedly performing the adsorption of the first reactant and the adsorption of the second reactant described above for about dozens to hundreds of cycles. Here, the third filling layer 143 may be formed from the upper surface of the second filling layer 142 in a bottom-up direction.

Accordingly, as the first through third filling layers 141 through 143 are sequentially formed in the gap 150, the bottom-up gap filling method, in which the filling materials are filled in the gap 150 from the bottom 150*b* of the gap 150 in the bottom-up direction, may be implemented. In the gap filling process described above, the reaction inhibitor remaining in the gap 150 may be removed by being changed into the filling material via ozone ($O_3$) processing and/or oxygen ($O_2$) plasma processing. Meanwhile, around the entrance of the gap 150 due to the formation of the first and second reaction inhibition layer 111 and 112 described above, for example, a hydroxy group formed by the reaction of TiCp*(OMe)$_3$ and water ($H_2O$) or water ($H_2O$), etc. may remain.

Although it is described above that the gap 150 is filled with the first through third filling layers 141, 142, and 143, this is only an example. The number of filling layers to fill the gap 150 may be modified in various ways.

Hereinafter, the blocking characteristic of the reaction inhibition layer formed by performing the water ($H_2O$) process on the TiCp*(OMe)$_3$ precursor is described.

A selectivity $S_x$ or evaluating the blocking characteristic of the reaction inhibition layer may be expressed by Equation 2 below.

$$S_x = \frac{R_{gs} - R_{ns}}{R_{gs} + R_{ns}} \qquad \text{Equation 2}$$

Here, $R_{gs}$ denotes a thickness of a formed film in a growth region, and $R_{ns}$ denotes a thickness of a formed film in a non-growth region where film forming is blocked by the reaction inhibition layer and its growth is hindered.

When $S_x$ is 1 (for example, 100%), this may correspond to the blocking characteristic of the reaction inhibition layer is perfect and no film forming is made in the non-growth region. When $S_x$ is 0 (for example, 0%), this may correspond to the reaction inhibition layer has no blocking characteristic and film forming is made in the non-growth region at the same film forming speed as in the growth region.

Figure 14A:
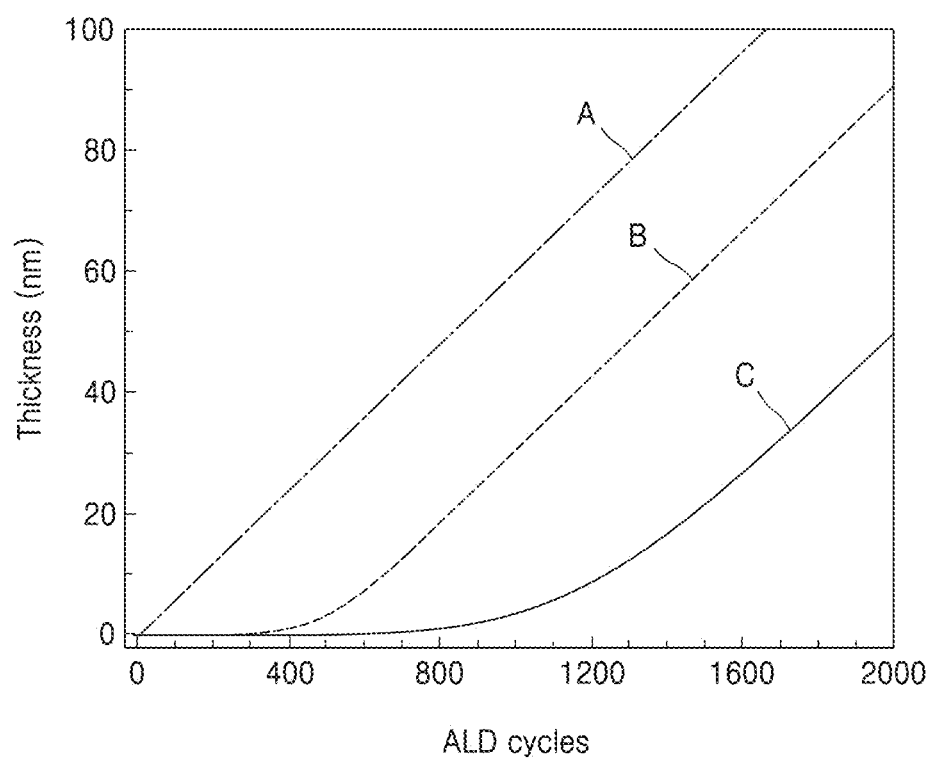
FIGS. 14A and 14B illustrate experimental results showing the blocking characteristic of a reaction inhibition layer formed by performing a water ($H_2O$) process on TiCp* $(OMe)_3$.
Figure 14B:
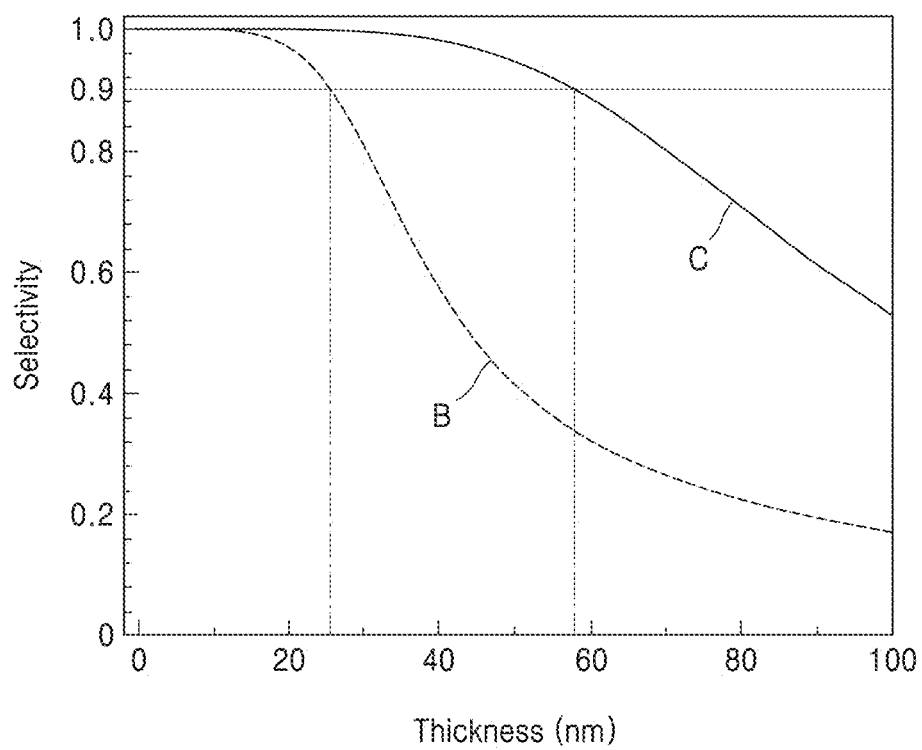

FIGS. 14A and 14B are experimental results showing the blocking characteristic of a reaction inhibition layer formed by performing a water ($H_2O$) process on TiCp*(OMe)$_3$. An exposure cycle of TiCp*(OMe)$_3$ was fixed to 300 cycles, and the blocking characteristic was compared depending on whether to perform the water ($H_2O$) process. In this case, when there is no water ($H_2O$) process, a process pressure was 5 torr, and when the water ($H_2O$) process was performed, the process pressure was 3 torr. A cycle of the water ($H_2O$) process was set to 40 cycles.

FIG. 14A is the experimental result showing a film forming delay effect of the reaction inhibition layer formed by performing the water ($H_2O$) process on TiCp*(OMe)$_3$. In FIG. 14A, "A" indicates a case where a TiO$_2$ thin film is formed (growth per cycle (GPC) is 0.6) by an ALD process. "B" indicates a case where a TiO$_2$ thin film is formed on the reaction inhibition layer including TiCp*(OMe)$_3$ without the water ($H_2O$) process. "C" indicates a case where a TiO$_2$ thin film is formed on the reaction inhibition layer formed by performing the water ($H_2O$) process on TiCp*(OMe)$_3$.

Referring to FIG. 14A, when there is no water ($H_2O$) process ("B"), there was the effect that film forming is delayed up to about 400 cycles of the ALD process, but when the water ($H_2O$) process is performed ("C"), there was the effect that film forming is delayed up to about 900 cycles of the ALD process. In addition, although the process pressure was decreased from 5 torr to 3 torr, the film forming delay effect was increased. As described above, it may be found that the blocking characteristic of the reaction inhibition layer was improved by performing the water ($H_2O$) process on TiCp*(OMe)$_3$.

FIG. 14B is the experimental result showing the selectivity of the reaction inhibition layer formed by performing the water ($H_2O$) process on TiCp*(OMe)$_3$. In FIG. 14B, "B" indicates a case where a TiO$_2$ thin film is formed on the reaction inhibition layer including TiCp*(OMe)$_3$ without the water ($H_2O$) process. "C" indicates a case where a TiO$_2$ thin film is formed on the reaction inhibition layer formed by performing the water ($H_2O$) process on TiCp*(OMe)$_3$.

Referring to FIG. 14B, when there is no water ($H_2O$) process, the maximum delay thickness satisfying the selectivity equal to or greater than 0.9 was 25 nm, but when the water ($H_2O$) process was performed, the maximum delay thickness satisfying the selectivity equal to or greater than 0.9 increased to 58 nm. This means that film forming is hardly made on the reaction inhibition layer formed by performing the water ($H_2O$) process even until the thickness of the ALD process is 58 nm.

Figure 15A:
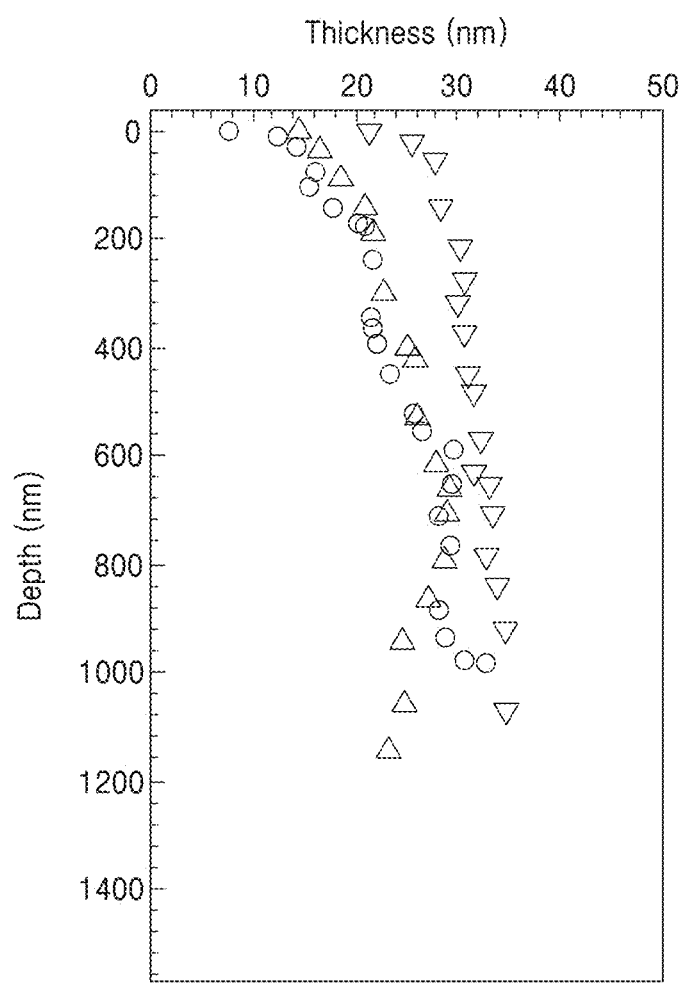
FIGS. 15A and 15B illustrate experimental results showing gap filling characteristics according to whether to perform a water ($H_2O$) process when $TiO_2$ fills in a gap of a high aspect ratio formed on a $SiO_2$ substrate.
Figure 15B:
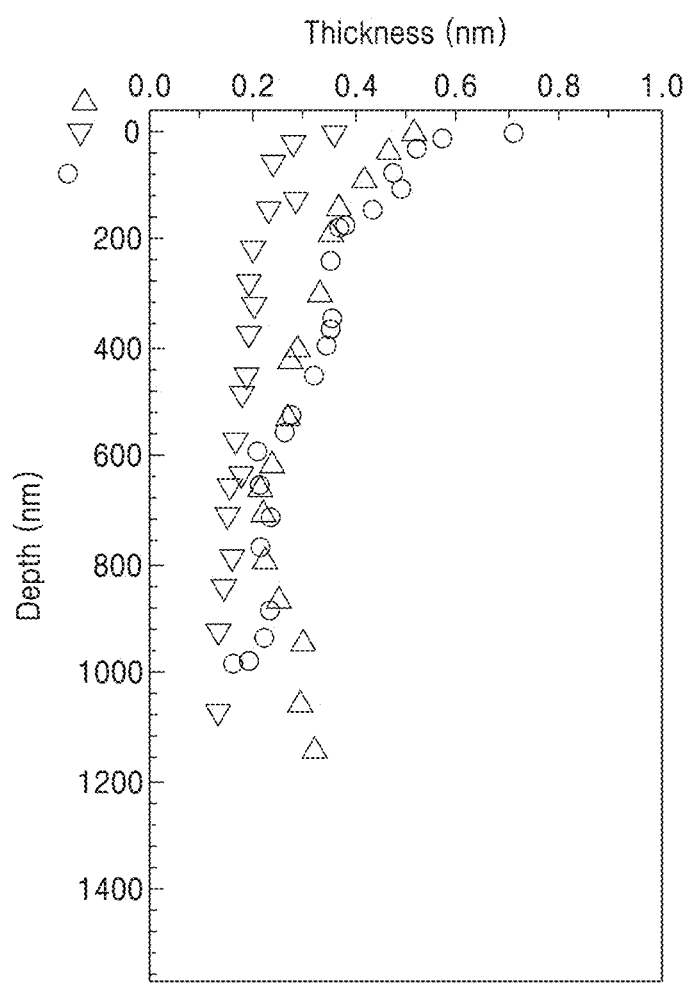

FIGS. 15A and 15B are experimental results showing gap filling characteristics according to whether to perform a water ($H_2O$) process when TiO$_2$ fills in a gap of a high aspect ratio formed on a SiO$_2$ substrate. FIG. 15A shows a film forming thickness according to a depth of the gap, and FIG. 15B shows the selectivity according to the depth of the gap.

In FIGS. 15A and 15B, "▽" and "Δ" indicate a case where the water ($H_2O$) process is not performed on TiCp*(OMe)$_3$, and "○" indicates a case where the water ($H_2O$) process is performed on TiCp*(OMe)$_3$. In "▽", the process pressure is 5 torr, and the exposure cycle of TiCp*(OMe)$_3$ is 300 cycles. In "Δ", the process pressure is 5 torr, and the exposure cycle of TiCp*(OMe)$_3$ is 500 cycles. In "○", the process pressure is 3 torr, the exposure cycle of TiCp*(OMe)$_3$ is 300 cycles, and each of a water ($H_2O$) process cycle and a purging cycle is 40 cycles.

Referring to FIGS. 15A and 15B, it may be found that when the exposure cycle of TiCp*(OMe)$_3$ is set to 300 cycles ("▽"), the film forming thickness rapidly increases according to the depth up to 300 nm but the film forming thickness gradually increases according to the depth greater than 300 nm. In addition, it may be found that the film forming thickness is increased because the selectivity at a surface of a substrate of an entrance of the gap is approximately 0.4.

It may be found that when the exposure cycle of TiCp*(OMe)$_3$ is increased to 500 cycles ("Δ"), the selectivity at a surface of a substrate of an entrance of the gap increased to approximately 0.5, and that the film forming thickness is also decreased. In addition, it is shown that the film forming thickness gradually increases according to the depth up to 800 nm. Therefore, the gap filling characteristics were improved compared to the case ("▽") where the exposure cycle of TiCp*(OMe)$_3$ is 300 cycles.

When the water ($H_2O$) process is performed on TiCp*(OMe)$_3$ ("○"), the film forming thickness gradually increased as the depth of the gap increased, and the selectivity varied in a wide range from 0.7 to 0.2, the gap filling characteristics were further improved compared to the case where the water ($H_2O$) process is not performed on TiCp*(OMe)$_3$.

According to some example embodiments, the second reaction inhibitor may be formed by removing a part of the ligand having adsorption characteristic from the first reaction inhibitor adsorbed into the side wall of the gap, and thus the adsorption density of the reaction inhibition layer may be increased, thereby improving the blocking characteristics of the reaction inhibition layer.

The reaction inhibition layer has the density gradient in which the density of the reaction inhibitor decreases from the entrance of the gap toward the bottom of the gap and the precursor material that does not forms a thin film by a reaction with the co-reactant, such as water ($H_2O$) or oxygen ($O_2$), used in the sequential ALD process, is used as the second reaction inhibitor, thereby implementing bottom-up gap filling, in which the gap is filled with the filling materials in a bottom-up direction. Alternatively or additionally, the second reaction inhibitor may include the precursor material having the same center metal as the precursor for forming the thin layer used in the sequential ALD process, and thus, the invagination of impurities may be prevented or reduced in likelihood of occurrence and/or of impact.

FIGS. 16 through 19 are diagrams illustrating a method of filling a gap 250 according to other embodiments. The method of filling the gap 250 according to the present embodiment is the same as the method of filling the gap 150 according to the above-described example embodiments, except for a process of first forming a first filling layer (241 in FIG. 17) in the gap 250.

Figure 16:
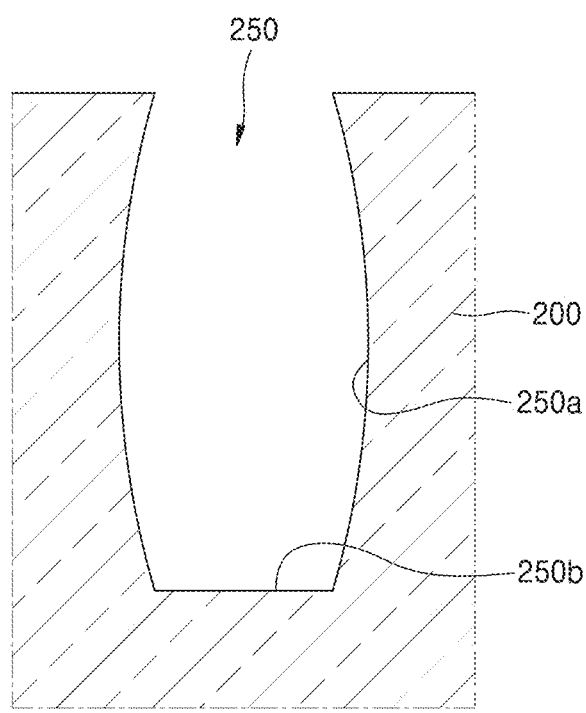
FIGS. 16 through 19 are diagrams illustrating a method of filling a gap according to some example embodiments.

Referring to FIG. 16, the gap 250 is formed in a substrate 200 to a certain depth. Here, a side wall 250a of the gap 250 may have, for example, a bowing shape. However, this is only an example, and in addition, the side wall 250a of the gap 250 may have various shapes. The substrate 200 including the gap 250 may be disposed in a reaction chamber (not shown) of an ALD apparatus.

Figure 17:
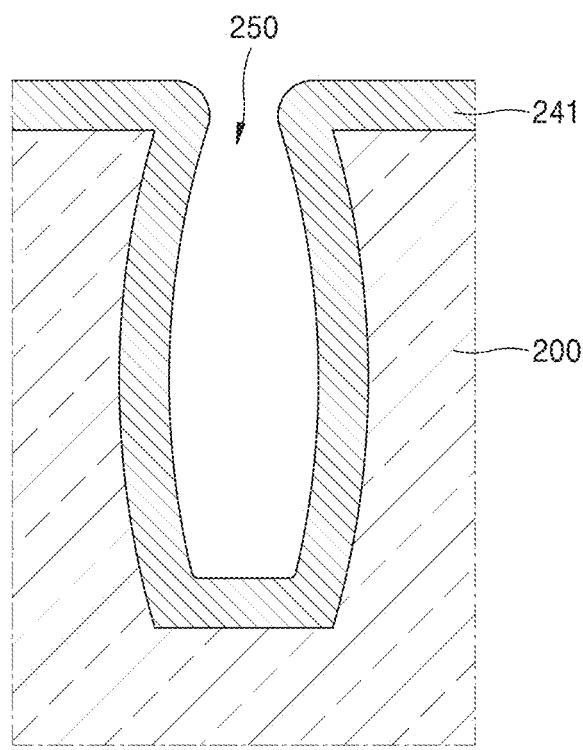

Referring to FIG. 17, the first filling layer 241 may be formed to have a certain thickness on a side wall 250a and a bottom 250b of the gap 250 by using an ALD process. First, a precursor layer (not shown) may be formed by adsorbing a first reactant into the side wall 250a and the bottom 250b of the gap 250. The first reactant may include a precursor material of a thin layer to be formed. For example, the first reactant may include at least one of TiCl$_4$, Ti(OiPr)$_4$, Ti(NMe$_2$)$_4$, Ti(NMeEt)$_4$, Ti(NEt$_2$)$_4$, ZrCl$_4$, Zr(NMe$_2$)$_4$, Zr(OtBu)$_4$, ZrCp$_2$Me$_2$, Zr(MeCp)$_2$(OMe)Me, HfCl$_4$, Hf(NMe$_2$)$_4$, Hf(NEtMe)$_4$, Hf(NEt$_2$)$_4$, HfCp$_2$Me$_2$, Hf(MeCp)$_2$(OMe)Me, or 6-diketonate Ru precursor, dicarbonyl-bis(5-methyl-2,4-hexanediketonato) Ru(II) ("Carish", $C_{16}H_{22}O_6Ru$), but the first reactant is not limited thereto. After the first precursor layer is formed, a purging process may be performed.

Thereafter, an atomic layer (not shown) may be formed by adsorbing having a second reactant into the precursor layer. The atomic layer may be formed via reaction between the first reactant and the second reactant. The second reactant may be a co-reactant and may include, for example, water ($H_2O$) or oxygen ($O_2$). Also, a purging process may be performed after the first precursor layer is formed.

The first filling layer 241 may be formed to have a certain thickness on the side wall 250a and the bottom 250b of the gap 250 by repeatedly performing the adsorption of the first reactant and the adsorption of the second reactant for about dozens to hundreds of cycles. Here, one cycle may include adsorption of the first reactant, purging, adsorption of the second reactant, and purging. The first filling layer 241 may include, for example, oxide, nitride, or metals, but is not limited thereto.

Figure 18:
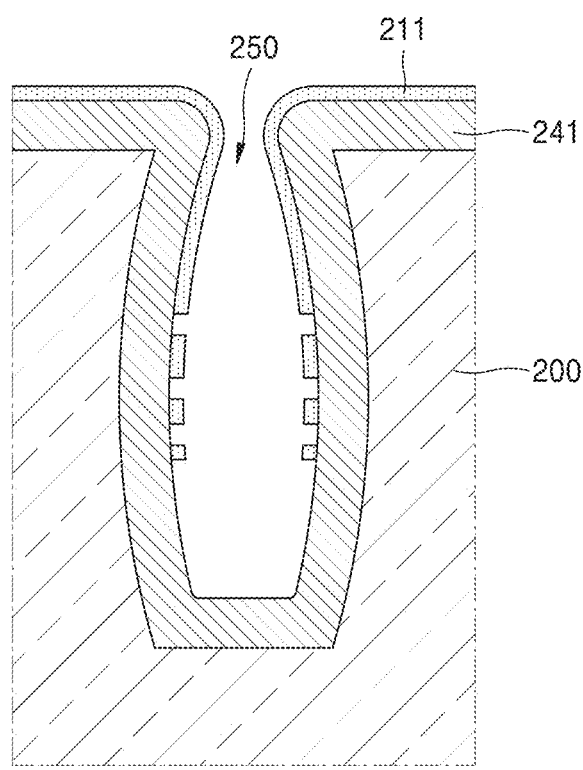

Referring to FIG. 18, a reaction inhibition layer 211 may be formed on the first filling layer 241 formed on the side wall 250a of the gap 250. The reaction inhibition layer 211 may be formed by adsorbing a reaction inhibitor into the first filling layer 241 formed on the side wall 250a of the gap 250, and then removing at least a part of a ligand having an adsorption characteristic from the reaction inhibitor by using a specific gas (e.g., water ($H_2O$)). The reaction inhibition layer 211 may have a density gradient in which a density of the reaction inhibitor decreases from an entrance of the gap 250 toward a bottom 250b of the gap 250. Formation of the reaction inhibition layer 211 is described above, and thus, a detailed description thereof is omitted. After the reaction inhibition layer 211 is formed, a purging process for discharging materials remaining in the reaction chamber to the outside may be performed.

Figure 19:
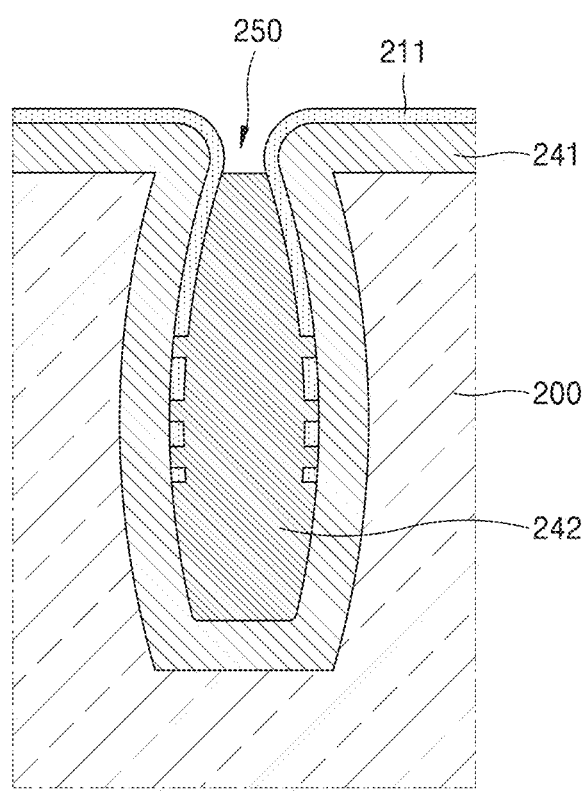

Referring to FIG. 19, after the reaction inhibition layer 211 is formed, the second filling layer 242 may be formed from the bottom 250b of the gap 250 in a bottom-up direction. The second filling layer 242 may include the same material as that of the first filling layer 241. The second filling layer 242 may be formed by repeatedly performing the adsorption of the first reactant and the adsorption of the second reactant described above for about dozens to hundreds of cycles. Formation of the second filling layer 242 is described above, and thus, a detailed description thereof is omitted. The filling materials may fill the gap 250 in the bottom-up direction by repeatedly performing the formation of the reaction inhibition layer 211 and the formation of the second filling layer 242 described above.

Some example embodiments may be usefully applied when the gap 250 formed in the substrate 200 does not have a high aspect ratio. When a reaction inhibitor is adsorbed into an inner wall of a gap of which aspect ratio is not high, the reaction inhibitor is adsorbed not only into a side wall of the gap but also into a bottom of the gap, and thus film forming may not be made. Accordingly, when the first filling layer 241 is thickly formed on the inner wall of the gap 250 using an ALD process before the reaction inhibition layer 211 is formed, the aspect ratio of the gap 250 may be greatly increased. As described above, the gap 250 may be filled with filling materials in a bottom-up direction, by applying the above-described method of filling the gap 250 to the gap 250 of which aspect ratio is greatly increased due to the formation of the first filling layer 241. Accordingly, a filling layer without a defect (e.g., void, etc.) may be formed even in the gap 250 of which aspect ratio is not high.

Figure 20:
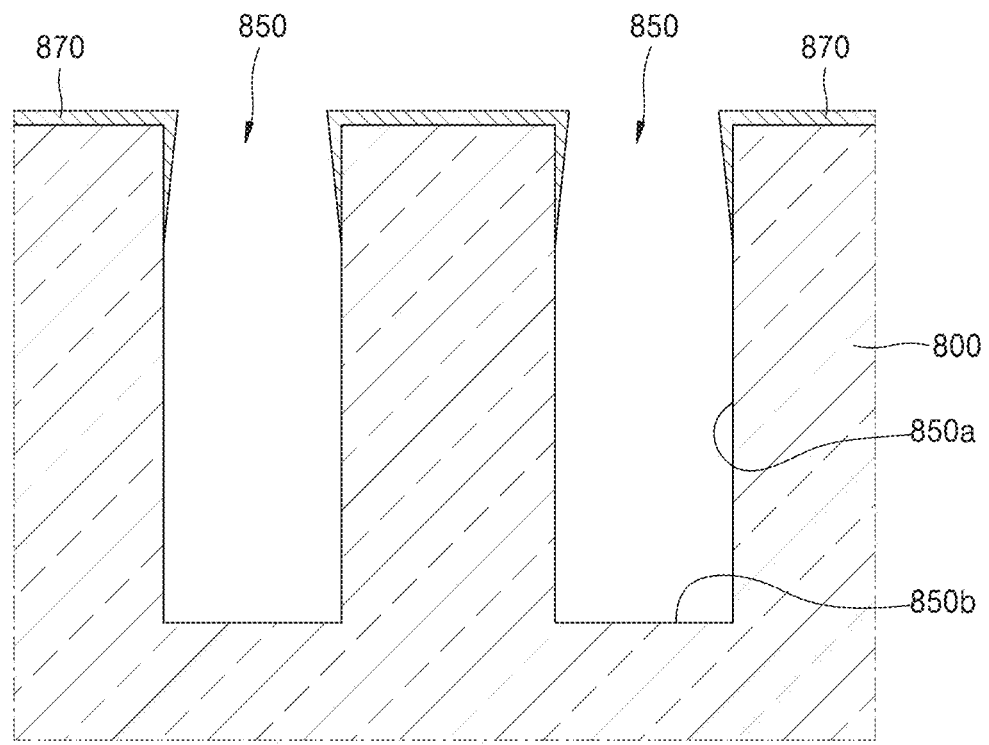
FIGS. 20 through 22 are diagrams illustrating a method of filling a gap according to some example embodiments.
Figure 21:
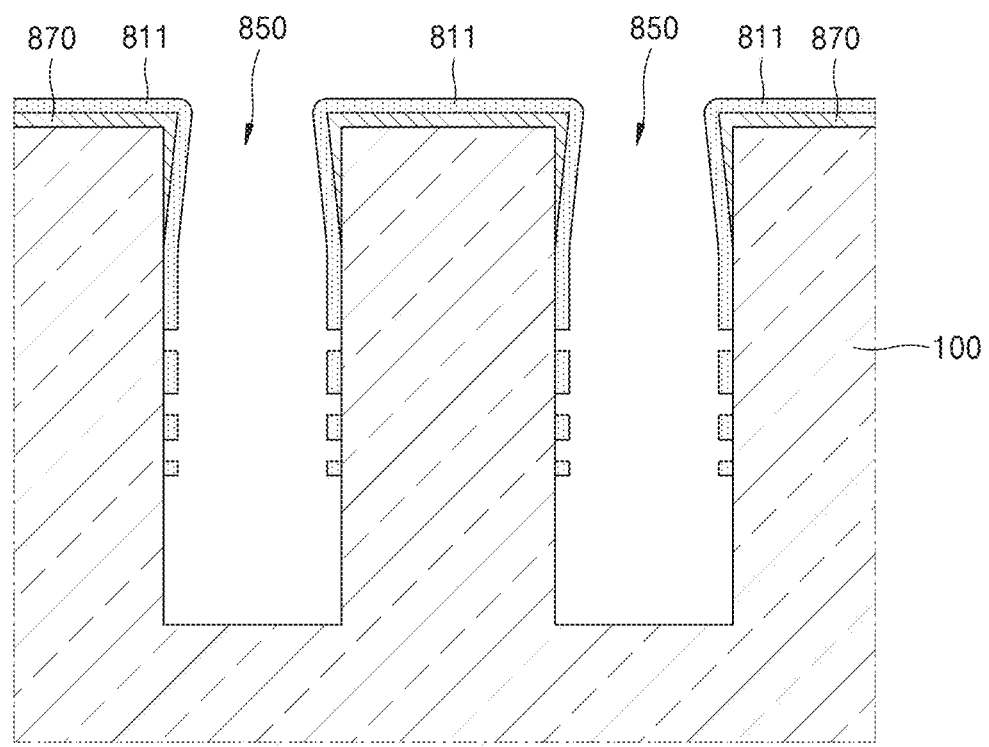
Figure 22:
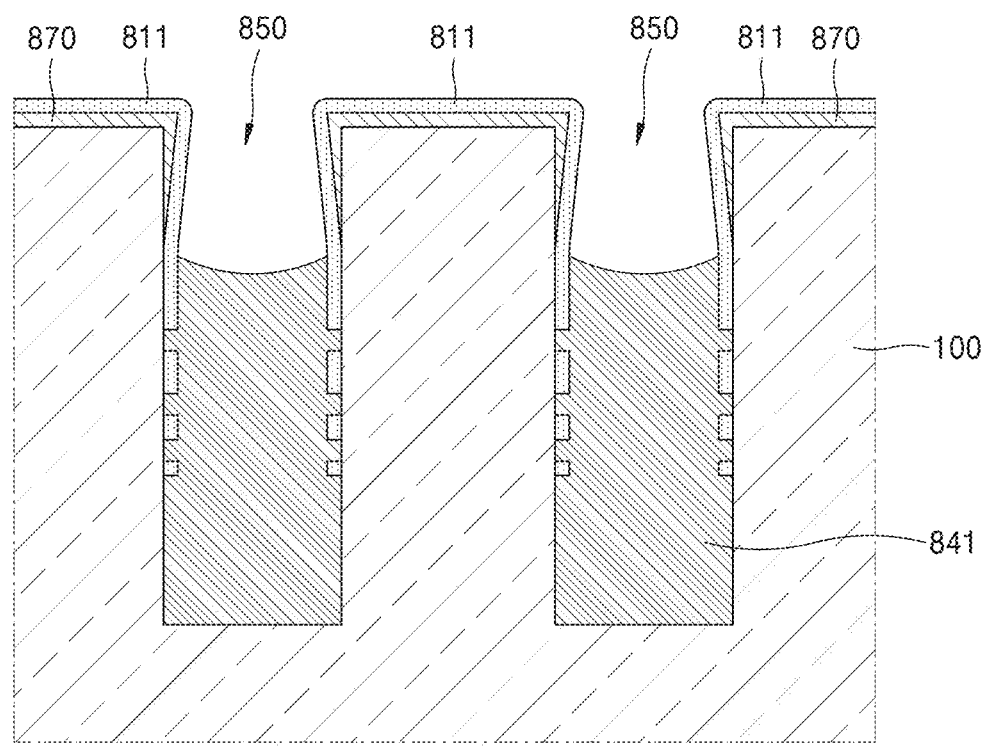

FIGS. 20 through 22 are diagrams illustrating a method of filling a gap 850 according to some example embodiments.

Referring to FIG. 20, a substrate 100 including the gap 850 may be disposed in a reaction chamber (not shown) of an ALD apparatus. The substrate 100 may include, for example, $SiO_2$. Next, a certain thin film layer 870 is formed on a surface of the substrate 100 around an entrance of the gap 850. Here, the thin film layer 870 may include, for example, $TiO_2$.

The thin film layer 870 including $TiO_2$ may be formed by using the following method. TiCp*(OMe)$_3$ is adsorbed only into the surface of the substrate 800 around the entrance of the gap 850 by exposing TiCp*(OMe)$_3$ to the surface of the substrate 800 for a short period of time. Next, when TiCp*(OMe)$_3$ reacts with a co-reactant such as oxygen plasma ($O_2$ Plasma) and/or ozone ($O_3$), the thin film layer 870 including $TiO_2$ may be formed on the surface of the substrate 100 around the entrance of the gap 850.

Referring to FIG. 21, a reaction inhibition layer 811 is formed on a side wall 850a of the gap 850. The reaction inhibition layer 811 may be formed by adsorbing a reaction inhibitor into the side wall 850a of the gap 850 and then removing at least a part of a ligand having an adsorption characteristic from the reaction inhibitor using a specific gas. Formation of the reaction inhibition layer 811 is described above, and thus, a detailed description thereof is omitted.

Referring to FIG. 22, after the reaction inhibition layer 811 is formed, a filling layer 841 may be formed from a bottom of the gap 850 in a bottom-up direction. Formation of the filling layer 841 is described above, and thus, a detailed description thereof is omitted.

The adsorption density of the reaction inhibitor may be generally different according to an adsorbed surface material. For example, the reaction inhibitor may have a greater adsorption density on a $TiO_2$ surface than on a $SiO_2$ surface. Therefore, as in the present embodiment, when the thin film layer 870 including $TiO_2$ is formed on the surface of the substrate 100 around the entrance of the gap 850 before the reaction inhibition layer 811 is formed, the reaction inhibition layer 811 having a greater adsorption density may be formed around the entrance of the gap 850. Accordingly, film forming is delayed around the entrance of the gap 850 and the gap 850 is filled with filling materials in the bottom-up direction, and thus the filling layer without a defect may be formed.

Hereinafter, an ALD apparatus for performing the method of filling the gap according to some example embodiments described above at a high speed is described.

Figure 23:
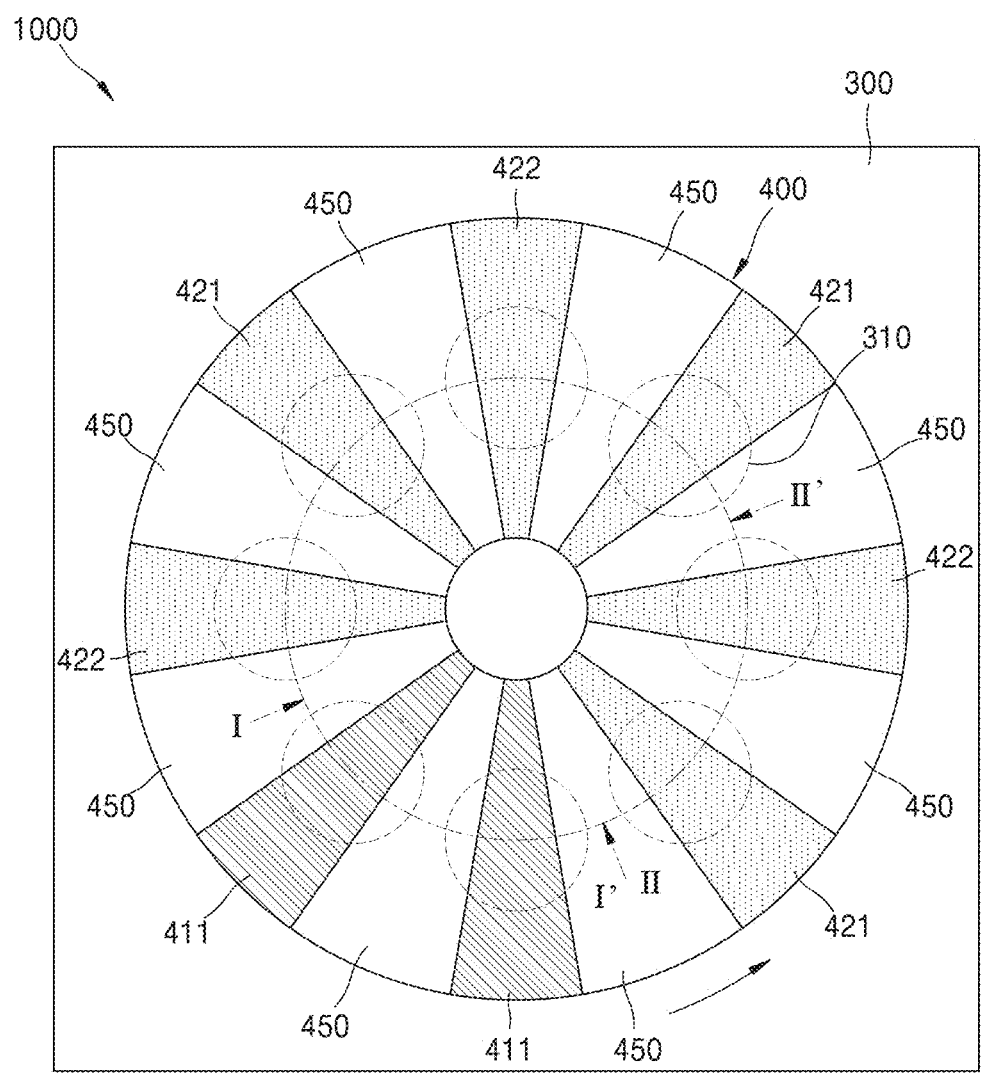
FIG. 23 is a schematic plan view of an atomic layer deposition (ALD) apparatus according to some example embodiments.
Figure 24:
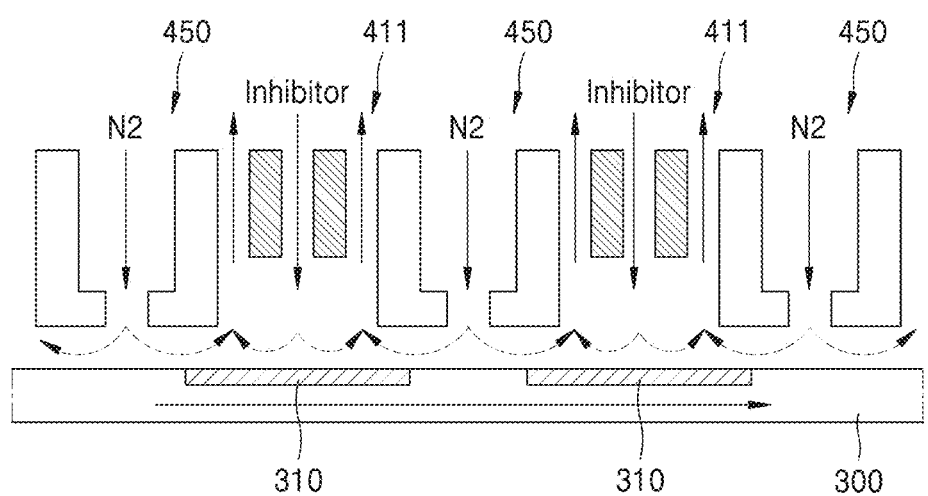
FIG. 24 is a cross-sectional view of the ALD apparatus taken along line I-I' of FIG. 23.
Figure 25:
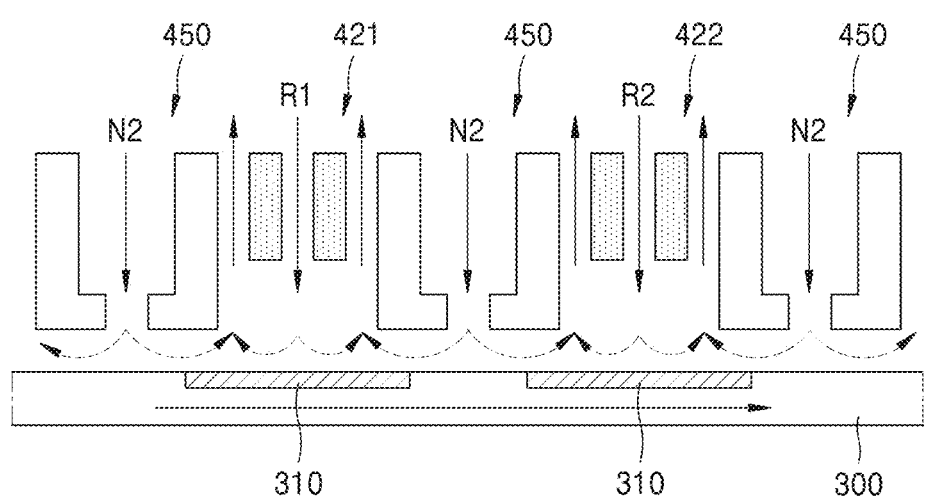
FIG. 25 is a cross-sectional view of the ALD apparatus taken along line II-II' of FIG. 23.

FIG. 23 is a schematic plan view of an ALD apparatus 1000 according to some example embodiments. FIG. 24 is a cross-sectional view of the ALD apparatus 1000, taken along line I-I' of FIG. 23. FIG. 25 is a cross-sectional view of the ALD apparatus 1000, taken along line II-II' of FIG. 23.

Referring to FIG. 23, the ALD apparatus 1000 may include an ALD substrate 300 and a reactant supply device 400 on the ALD substrate 300. A plurality of processing areas 310 may be provided on the substrate 300, and at least one gap (not shown) to be filled may be formed on each of the processing areas 310. For example, the plurality of processing areas 310 may include a plurality of wafers (e.g. a plurality of wafers having a diameter of 200 mm, or 300 mm, or 450 mm) provided on the process substrate 300. The plurality of wafers may correspond to the substrate 100 described above; however, example embodiments are not limited thereto. The plurality of processing areas 310 may be arranged to have a circular shape externally surrounding the ALD substrate 300. FIG. 23 illustrates an example in which eight processing areas 310 are provided on the substrate 300. However, the number of processing areas provided on the substrate 300 is not limited thereto and may vary.

The reactant supply device 400 may be configured to fill the gaps by supplying a reactant on the processing areas 310 of the process substrate 300 and may include at least one first supply unit 411, at least one second supply unit 421, and at least one third supply unit 422. The substrate 300 and the reactant supply device 400 may be provided to be relatively rotatable. In general, the reactant supply device 400 may be fixed and the substrate 300 may be rotatable. However, example embodiments are not limited thereto. The ALD substrate 300 may be fixed and the reactant supply device 400 may be rotatable.

The at least one first supply unit 411, the at least one second supply unit 421, and the at least one third supply unit 422 may be arranged to have a circular shape along the plurality of processing areas 310. Also, each of purging units 450 may be provided between the first through third supply units 411, 421, and 422. FIG. 23 illustrates an example in which the reactant supply device 400 includes two first supply units 411, three second supply units 421, and three third supply units 422, and the purging unit 450 is provided between the first through third supply units 411, 421, and 422. However, the disclosure is not limited thereto, and the numbers of first through third supply units 411, 421, and 422 may vary.

Each processing area 310 on the substrate 300 may be supplied with a reaction inhibitor, a first reactant, and a second reactant via rotation from the first through third supply units 411, 421, and 422. Thus, the gaps formed in the processing areas 310 may be filled in the bottom-up direction as described above.

FIG. 24 illustrates that a reaction inhibitor is supplied to each processing area 310. Referring to FIG. 24, the first supply unit 411 may supply the reaction inhibitor to each processing area 310 of the substrate 300 which rotates. The reaction inhibitor may include, for example, a precursor material that does not form a thin film by a reaction with water ($H_2O$) and/or oxygen ($O_2$). FIG. 24 illustrates the example in which the two first supply units 411 supply the reaction inhibitor. However, example embodiments are not limited thereto, and only one of the two first supply units 411 may supply the reaction inhibitor.

When a second reactant (e.g., water ($H_2O$)) is supplied to the reaction inhibitor from the third supply unit 422 to be described later, at least a part of the ligand having adsorption characteristics is removed from the precursor material of the reaction inhibitor, and thus the reaction inhibition layer having the increased adsorption density may be formed. This has been described above, and thus a description thereof is omitted.

The purging unit 450 may be provided around each of the first supply units 411. While the first supply units 411 supply the reaction inhibitor to the processing areas 310, the purging units 450 may supply a purging gas, such as a $N_2$ gas, between the processing areas 310.

The reaction inhibition layer formed on the side wall of the gap may have a density gradient in which the density of the reaction inhibitor decreases toward the bottom of the gap as described above. To this end, the exposure time of the processing area 310 to the reaction inhibitor may have to be controlled. The exposure time may be controlled via adjusting a rotation speed and the number of rotations of the substrate 300.

FIG. 25 illustrates that after the reaction inhibition layer is formed, a first reactant R1 and a second reactant R2 are supplied to each processing area 310. Referring to FIG. 25, the second supply unit 421 may supply the first reactant R1 to each processing area 310 so as to form a precursor layer at a bottom of the gap and around the gap. The first reactant R1 may include a precursor material of a thin layer to be formed. Also, the third supply unit 422 may supply the second reactant to each processing area 310. Here, the second reactant R2 may be a co-reactant and may include, for example, water ($H_2O$) or oxygen ($O_2$). Thus, the second reactant R2 may react with the precursor layer so as to form an atomic layer at the bottom of the gap and around the gap.

The supply of the first and second reactants R1 and R2 as described above may be simultaneously performed on the processing areas 310 of the substrate 300 by the second and third supply units 421 and 422. During this process, in order to prevent the mixing of the first reactant R1 with the second reactant R2, the purging unit 450 provided around each of the second and third supply units 421 and 422 may supply a purging gas between the processing areas 310.

As described above, the gaps formed in the processing areas 310 may be filled at a high speed by repeatedly supplying the first and second reactants R1 and R2 to the processing areas 310 of the substrate 300 which rotates. Also, the substrate 300 includes the plurality of processing areas 310 that are spatially divided, and the gap-filling operation may be simultaneously performed on the plurality of processing areas 310, and thus the processing time may be reduced.

The method of filling the gap according to some example embodiments described above may be applied as a technology of manufacturing various devices including optical devices and semiconductor devices requiring high precision and high aspect ratio. Hereinafter, examples of various devices implemented by using the method of filling the gap according to some example embodiments described above are described.

Figure 26A:
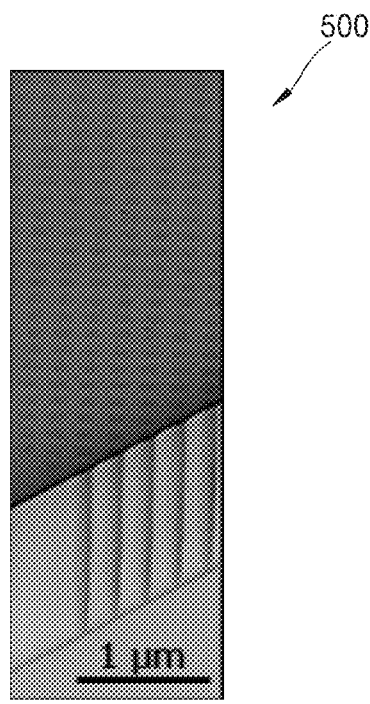
FIGS. 26A to 26C illustrate a meta lens implemented according to some example embodiments.
Figure 26B:
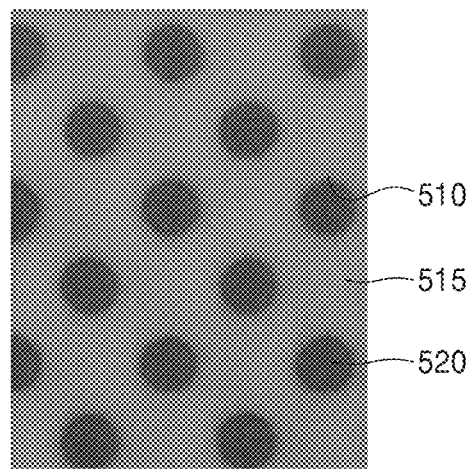
Figure 26C:
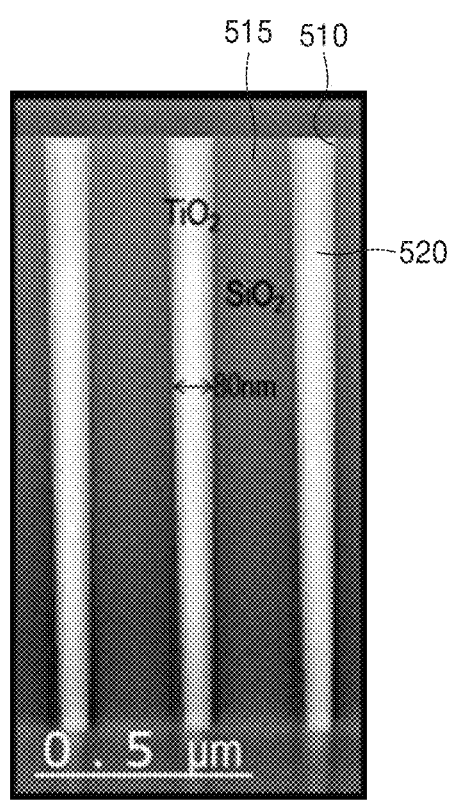

FIGS. 26A to 26C are electron microscope (e.g. scanning electron microscope) photos illustrating a meta lens 500 (specifically, a visible meta lens) implemented according to some example embodiments. FIGS. 26B and 26C are a plan view and a cross-sectional view of the inside of the meta lens 500, respectively.

Referring to FIGS. 26A to 26C, the meta lens 500 may include a nanostructure 515 in which a plurality of gaps 510 are formed, and a filling layer 520 provided to fill the plurality of gaps 510. Here, the filling layer 520 may include a high refractive dielectric material having a refractive index greater than that of the nanostructure 515. For example, the nanostructure 515 may include $SiO_2$, and the filling layer 520 may include $TiO_2$.

Each of the gaps 510 may have a width of less than or equal to 10 nm, and, for example, a high aspect ratio greater than or equal to approximately 10. By using the gap filling technology as described above, the gaps 510 having the high aspect ratio may be filled with the filling layer 520 without a defect such as a void.

Figure 27:
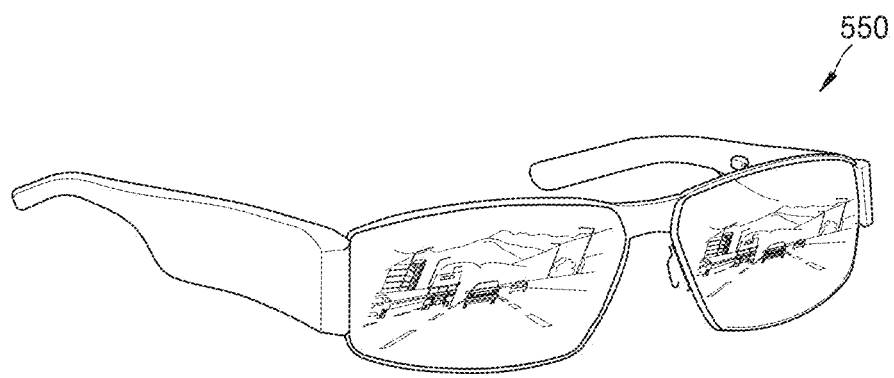
FIG. 27 illustrates augmented reality (AR) glasses as an example of a near-eye display device.

The meta lens 500 described above may be applied to various devices such as a near-eye display device, a smart phone, a drone, etc. FIG. 27 illustrates augmented reality (AR) glasses 550 as an example of a near-eye display device.

Figure 28:
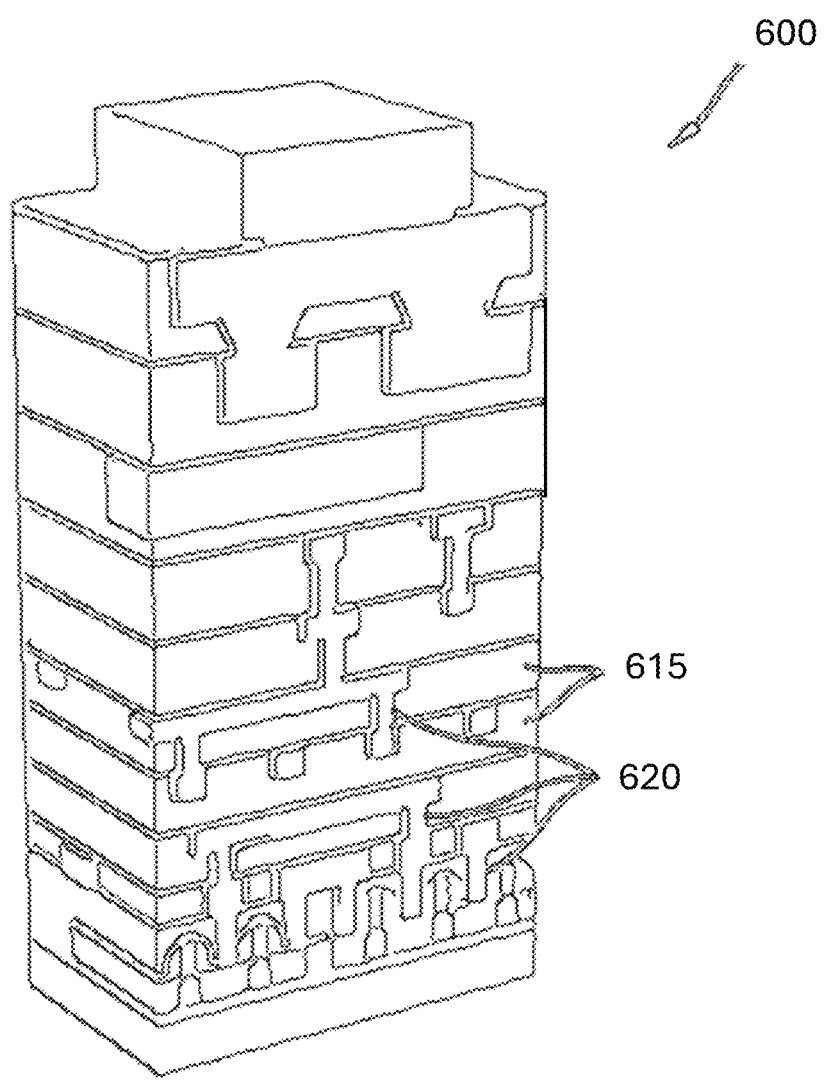
FIG. 28 shows an example of a dynamic random access memory (DRAM) device including an interconnect structure implemented according to some example embodiments.

FIG. 28 shows an example of a dynamic random access memory (DRAM) device 600 including an interconnect structure implemented according to some example embodiments.

Referring to FIG. 28, the interconnect structure of the DRAM device 600 may include an insulating layer 615 in which a plurality of gaps having a high aspect ratio are formed, and a filling layer 620 provided to fill the plurality of gaps. Here, the insulating layer 615 may include, for example, inter layer dielectric (ILD) or inter metal dielectric (IMD). In addition, the filling layer 620 may include a metal material having excellent conductivity.

In the interconnect structure, a seamless interconnection without a void may be formed by filling a conductive material in each of the plurality of gaps having the high aspect ratio using the gap filling technology as described above.

Figure 29:
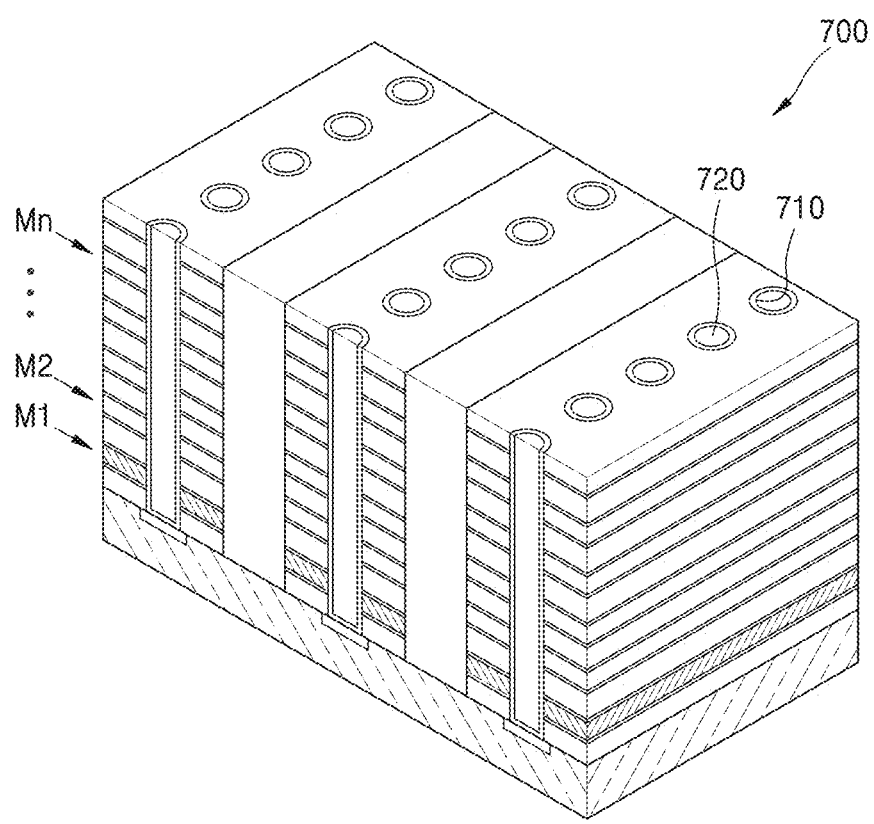
FIG. 29 shows an example of a three-dimensional (3D) NAND flash memory device implemented according to some example embodiments.

FIG. 29 shows an example of a three-dimensional (3D) NAND flash memory device 700 implemented according to some example embodiments.

Referring to FIG. 29, a plurality of memory cells M1, M2, . . . , Mn are stacked in a vertical direction (z-axis direction). Further, gaps 710 having a high aspect ratio are formed to pass through the plurality of memory cells M1, M2, . . . , Mn, and a filling layer 720 including an insulating material is filled in each of the gaps 710. The filling layer 720 without a defect such as a void may be formed by filling the insulating material in each of the gaps 710 having the high aspect ratio using the gap filling technology as described above.

The above-mentioned devices 500, 600, and 700 are merely examples, and the gap filling technology according to some example embodiments may be applied to the manufacture of various devices requiring high aspect ratio and high precision. While one or more embodiments have been described, it will be understood by one of ordinary skill in the art that various changes in form and details may be made therein without departing from the spirit and scope as defined by the following claims.

According to some example embodiments, the reaction inhibition layer may be formed by removing a part of the ligand having adsorption characteristic from the reaction inhibitor adsorbed into the side wall of the gap, and thus the adsorption density may be increased, thereby improving the blocking characteristics of the reaction inhibition layer.

The reaction inhibition layer has the density gradient in which the density of the reaction inhibitor decreases from the entrance of the gap toward the bottom of the gap and the precursor material that does not forms a thin film by a reaction with the co-reactant, such as water ($H_2O$) and/or oxygen ($O_2$), used in the sequential ALD process, is used as the reaction inhibitor, thereby implementing bottom-up gap filling, in which the gap is filled with the filling materials in a bottom-up direction. Also, the reaction inhibitor may be formed by using the precursor material having the same center metal as the precursor for forming the thin layer to be used in the sequential ALD process, and thus, invagination of impurities may be prevented or reduced in likelihood of occurrence and/or of impact.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that various example embodiments described herein should be considered in a descriptive sense only and not for purposes of limitation. Descriptions of features or aspects within each embodiment should typically be considered as available for other similar features or aspects in other example embodiments, and example embodiments are not necessarily mutually exclusive with one another. While one or more example embodiments have been described with reference to the figures, it will be understood by those of ordinary skill in the art that various changes in form and details may be made therein without departing from the spirit and scope as defined by the following claims.

What is claimed is:

1. A method of filling a gap formed on a substrate, the method comprising:
   forming a first reaction inhibition layer on a side wall of the gap;
   forming a first precursor layer by adsorbing a first reactant into a bottom of the gap and into the side wall of the gap around the bottom of the gap; and
   forming a first atomic layer on the bottom of the gap and the side wall of the gap around the bottom of the gap by adsorbing a second reactant into the first precursor layer,
   wherein the forming of the first reaction inhibition layer comprises,
   adsorbing a first reaction inhibitor into the side wall of the gap, and
   forming a second reaction inhibitor by removing a specific ligand from the first reaction inhibitor,
   wherein the first reaction inhibitor is adsorbed to have a density gradient in which a density of the first reaction inhibitor decreases toward the bottom of the gap, and
   the second reaction inhibitor comprises a precursor material that does not react with the second reactant.

2. The method of claim 1,
   wherein the second reaction inhibitor is formed by removing at least a part of a ligand having an adsorption characteristic from the first reaction inhibitor by using a specific gas.

3. The method of claim 2,
   wherein the second reaction inhibitor has a greater adsorption density than that of the first reaction inhibitor.

4. The method of claim 1,
   wherein the density gradient of the first reaction inhibitor is determined based on equation $$l = \frac{4w}{3}\left(\sqrt{1 + \frac{3}{8}\left(\frac{Pt}{S\sqrt{2\pi mkT}}\right)} - 1\right)$$

wherein, $l$ denotes a depth in nm at a location of the side wall of the gap into which the first reaction inhibitor is adsorbed, w denotes a width in nm of the gap, P denotes a partial pressure Pa of the first reaction inhibitor in a reaction chamber, t denotes an exposure time s of the first reaction inhibitor, S denotes a saturation dose ($\approx 2.5 \times 10^{18}$ molecules·meter), m denotes a molecular mass in kg of the first reaction inhibitor, k denotes a Boltzmann factor equal to $1.38 \times 10^{-23}$ Joules/Kelvin, and T denotes a temperature in the reaction chamber measured in Kelvins.

5. The method of claim 1,
   wherein the first reaction inhibitor comprises a center metal and an organic ligand.

6. The method of claim 1,
   wherein the second reaction inhibitor is oxidized by at least one of ozone ($O_3$) or oxygen ($O_2$) plasma.

7. The method of claim 1,
   wherein the second reaction inhibitor does not react with water ($H_2O$) and does not react with oxygen ($O_2$).

8. The method of claim 1, further comprising:
   forming a first filling layer by repeatedly performing the forming of the first precursor layer and the forming of the first atomic layer for a plurality of cycles.

9. The method of claim 8,
   wherein a density of the first reaction inhibitor decreases toward the bottom of the gap so that the first filling layer is formed from the bottom of the gap in a bottom-up direction.

10. The method of claim 8, further comprising:
    after forming the first filling layer, forming a second reaction inhibition layer on the side wall of the gap;
    forming a second precursor layer on an upper surface of the first filling layer and the side wall of the gap around the upper surface of the first filling layer; and
    forming a second atomic layer on the upper surface of the first filling layer and the side wall of the gap around the upper surface of the first filling layer.

11. The method of claim 10, further comprising:
    forming a second filling layer from the upper surface of the first filling layer in a bottom-up direction by repeatedly performing the forming of the second precursor layer and the forming of the second atomic layer for the plurality of cycles.

12. The method of claim 1, further comprising:
before forming the first reaction inhibition layer on the side wall of the gap, forming an upper atomic layer on a surface of the substrate around an entrance of the gap.

13. A method of filling a gap formed on a substrate, the method comprising:
forming a first filling layer by sequentially adsorbing first and second reactants into a side wall and a bottom of the gap;
forming a first reaction inhibition layer on the first filling layer formed on the side wall of the gap;
forming a first precursor layer by adsorbing the first reactant into the first filling layer formed on the bottom of the gap and around the bottom of the gap; and
forming a first atomic layer on the first filling layer formed on the bottom of the gap and around the bottom of the gap by adsorbing the second reactant into the first precursor layer,
wherein the forming of the first reaction inhibition layer comprises,
adsorbing a first reaction inhibitor into the side wall of the gap, and
forming a second reaction inhibitor by removing a specific ligand from the first reaction inhibitor,
wherein the first reaction inhibitor is adsorbed to have a density gradient in which a density of the first reaction inhibitor decreases toward the bottom of the gap, and
the second reaction inhibitor comprises a precursor material that does not react with the second reactant.

14. The method of claim 13, further comprising forming:
a second filling layer from an upper surface of the first filling layer in a bottom-up direction by repeatedly performing the forming of the first precursor layer and the forming of the first atomic layer for a plurality of cycles.

* * * * *